(12) United States Patent
Park et al.

(10) Patent No.: US 12,009,372 B2
(45) Date of Patent: Jun. 11, 2024

(54) DISPLAY DEVICE INCLUDING HYDROGEN DIFFUSION BARRIER FILM, AND METHOD FOR MANUFACTURING SAME

(71) Applicant: ISAC RESEARCH INC., Daejeon (KR)

(72) Inventors: Jin-Seong Park, Seongnam-si (KR); Seong-Hyeon Lee, Busan (KR); Ju-Hwan Han, Seoul (KR); Hyun-Jun Jeong, Goyang-si (KR)

(73) Assignee: ISAC RESEARCH INC., Daejeon (KR)

( * ) Notice: Subject to any disclaimer, the term of this patent is extended or adjusted under 35 U.S.C. 154(b) by 371 days.

(21) Appl. No.: 17/601,860

(22) PCT Filed: Mar. 27, 2020

(86) PCT No.: PCT/KR2020/004236
§ 371 (c)(1),
(2) Date: Oct. 6, 2021

(87) PCT Pub. No.: WO2020/209535
PCT Pub. Date: Oct. 15, 2020

(65) Prior Publication Data
US 2022/0208806 A1 Jun. 30, 2022

(30) Foreign Application Priority Data
Apr. 9, 2019 (KR) .......................... 10-2019-0041549

(51) Int. Cl.
*H01L 27/12* (2006.01)

(52) U.S. Cl.
CPC ...... *H01L 27/1274* (2013.01); *H01L 27/1225* (2013.01); *H01L 27/1248* (2013.01)

(58) Field of Classification Search
None
See application file for complete search history.

(56) References Cited

U.S. PATENT DOCUMENTS

2017/0330938 A1* 11/2017 Baeck ............... H01L 29/41775
2019/0153595 A1* 5/2019 Wang ...................... C23C 16/40

FOREIGN PATENT DOCUMENTS

| CN | 106756877 A | * | 5/2017 |
| JP | 2012-212714 A | | 11/2012 |
| JP | 2014-220492 A | | 11/2014 |
| JP | 2017-531322 A | | 10/2017 |
| KR | 10-0166910 B1 | | 2/1999 |

(Continued)

OTHER PUBLICATIONS

Machine-generated English translation of KR 20150101417 (Year: 2015).*

(Continued)

*Primary Examiner* — Bo B Jang
(74) *Attorney, Agent, or Firm* — Sughrue Mion, PLLC

(57) ABSTRACT

A display device may comprise: a substrate including a driving area and a pixel area; a first transistor on the driving area; a second transistor on the pixel area; a first hydrogen diffusion barrier film between a first active layer and a first gate insulating film of the first transistor; and a second hydrogen diffusion barrier film between a second active layer and a second gate insulating film of the second transistor.

11 Claims, 25 Drawing Sheets

(56) References Cited

FOREIGN PATENT DOCUMENTS

| KR | 10-0507864 B1 | 8/2005 |
| KR | 10-2015-0020737 A | 2/2015 |
| KR | 10-2015-0101417 A | 9/2015 |
| KR | 10-2015-0101418 A | 9/2015 |
| KR | 10-2016-0073923 A | 6/2016 |
| KR | 10-2018-0072363 A | 6/2018 |

OTHER PUBLICATIONS

International Search Report for PCT/KR2020/004236 dated Jun. 30, 2020 (PCT/ISA/210).

* cited by examiner

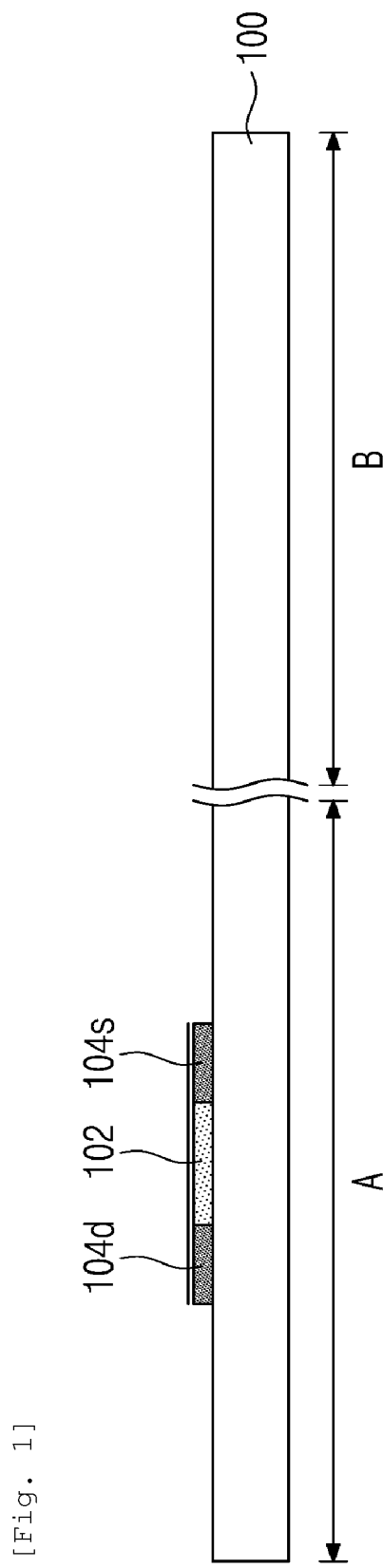

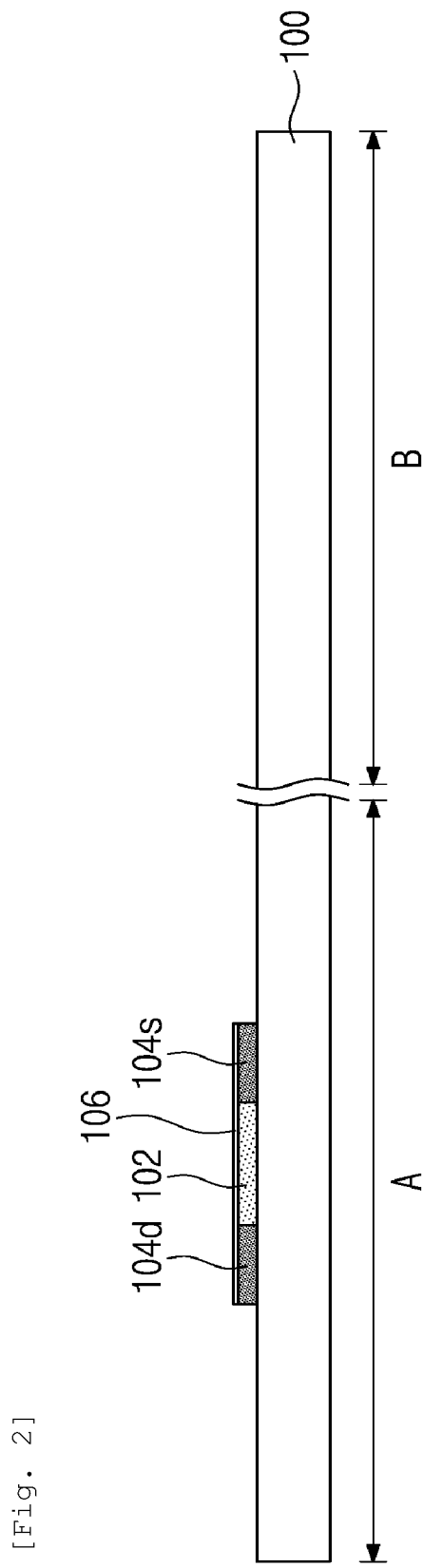

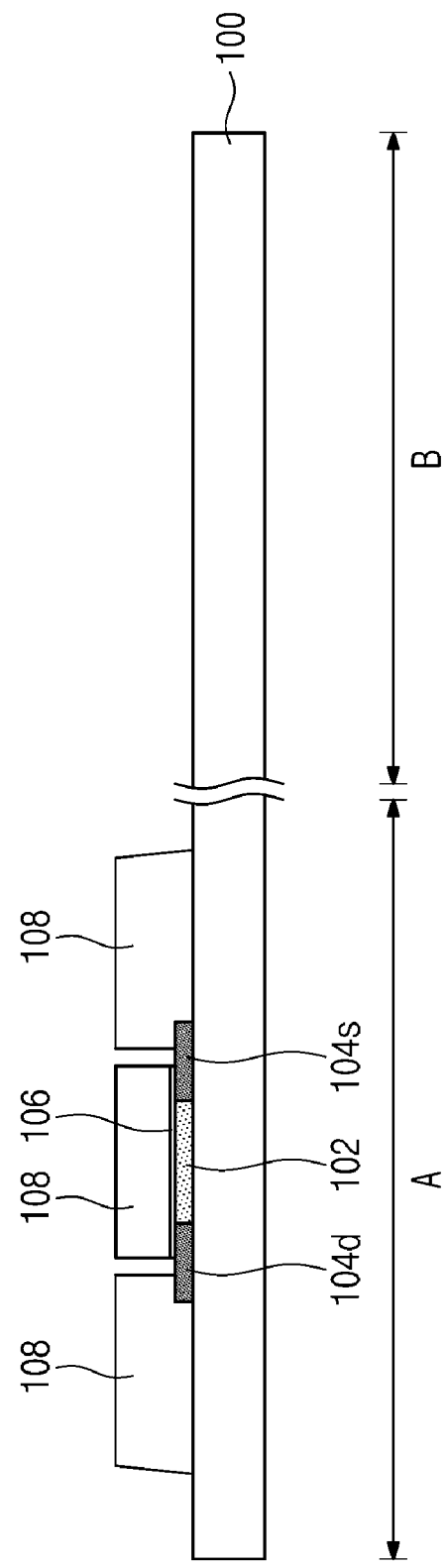
[Fig. 3]

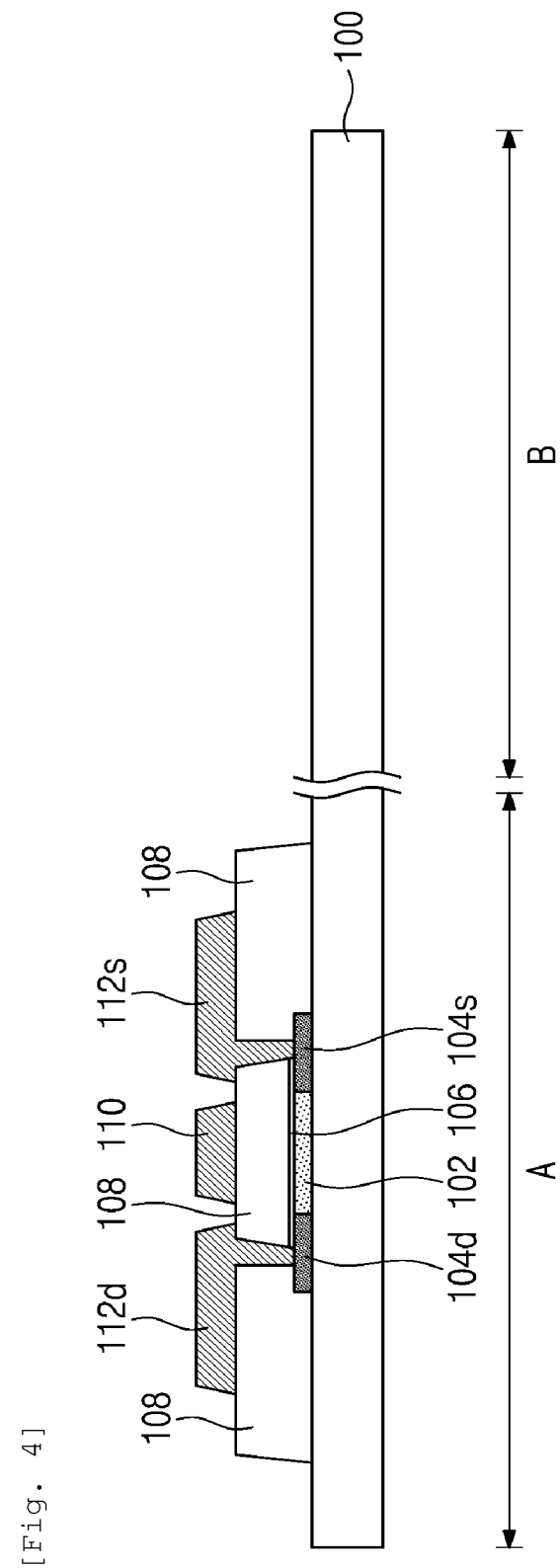

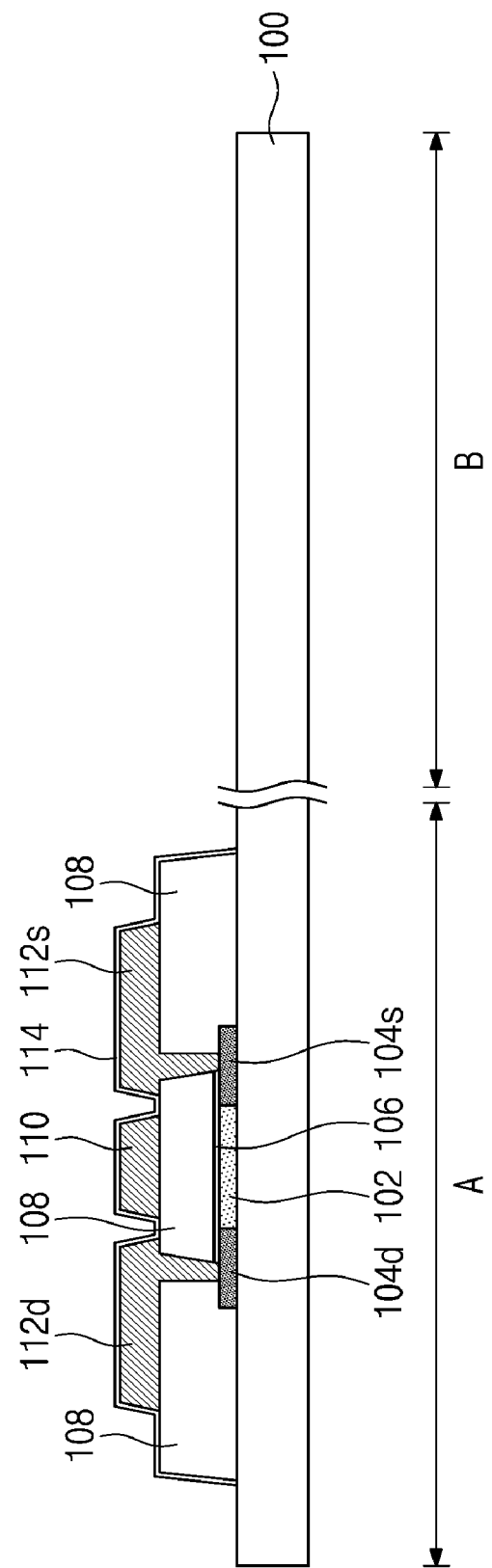
[Fig. 5]

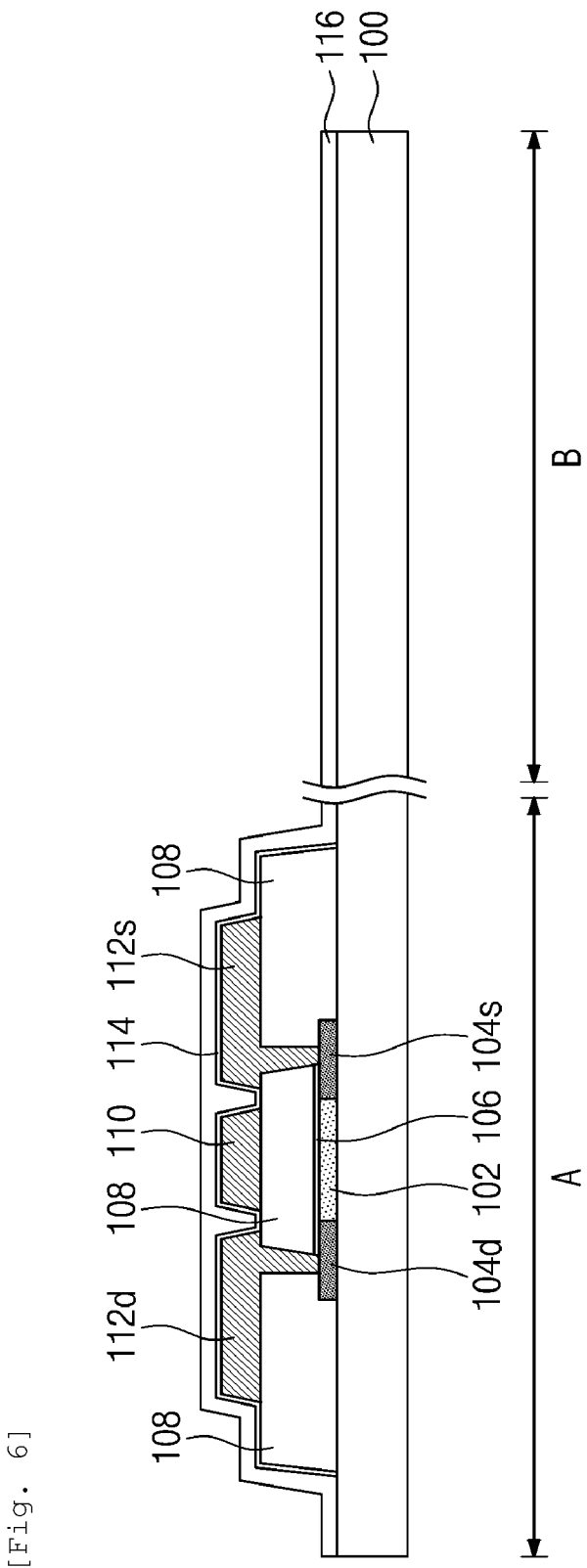
[Fig. 6]

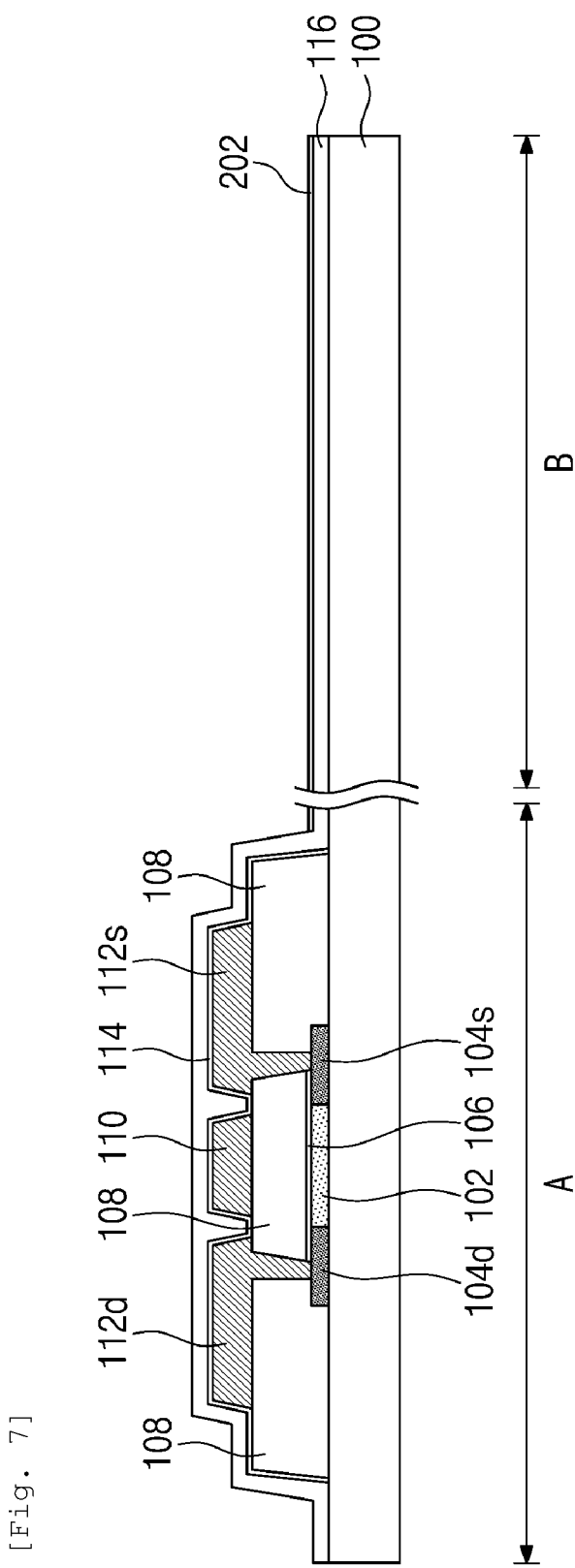

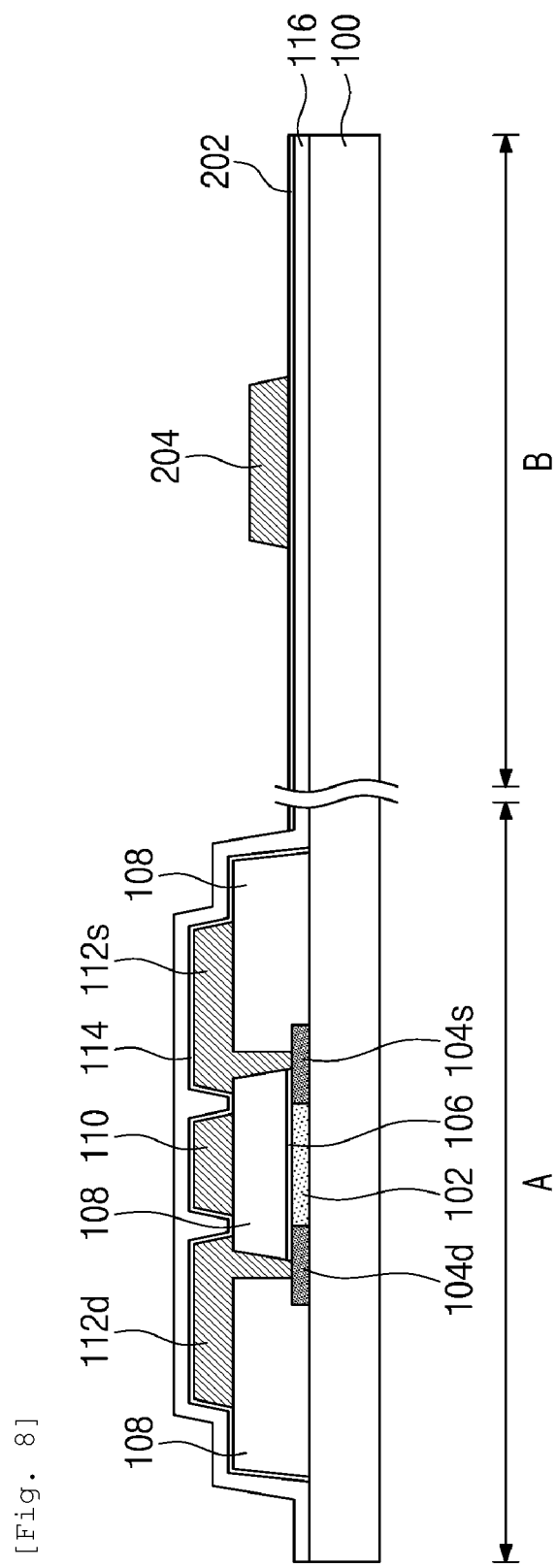
[Fig. 8]

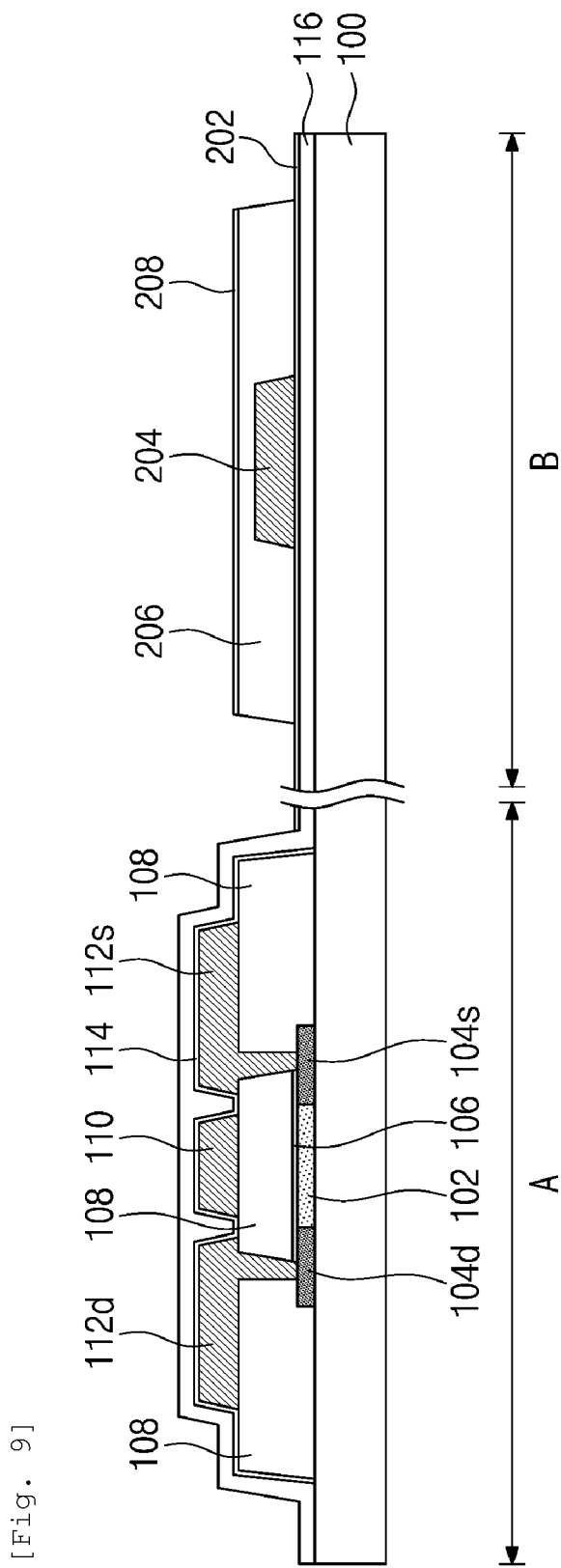
[Fig. 9]

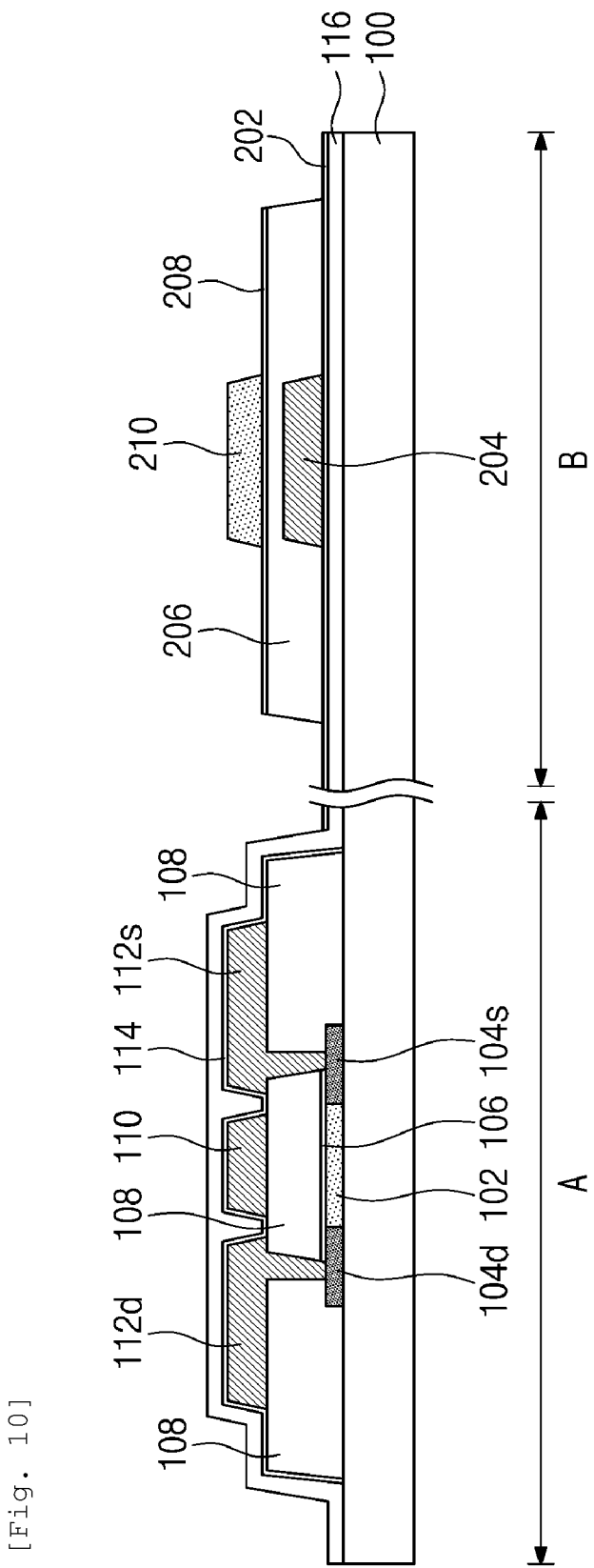
[Fig. 10]

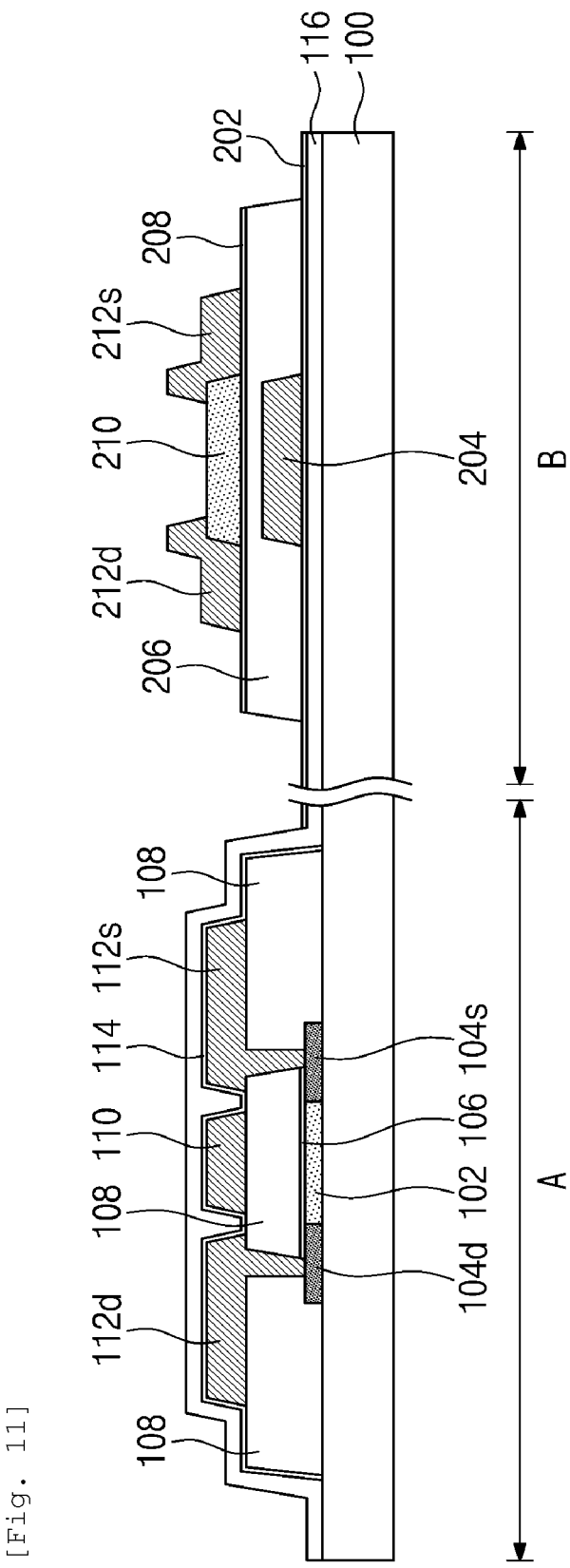
[Fig. 11]

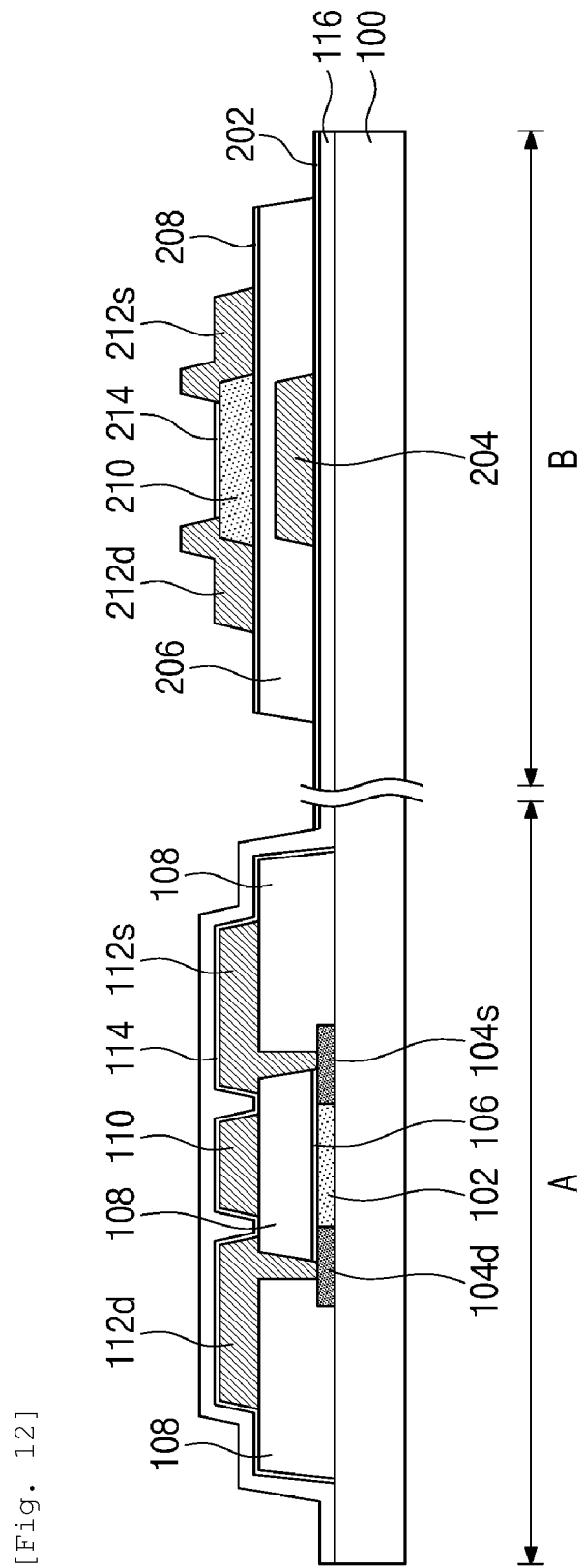
[Fig. 12]

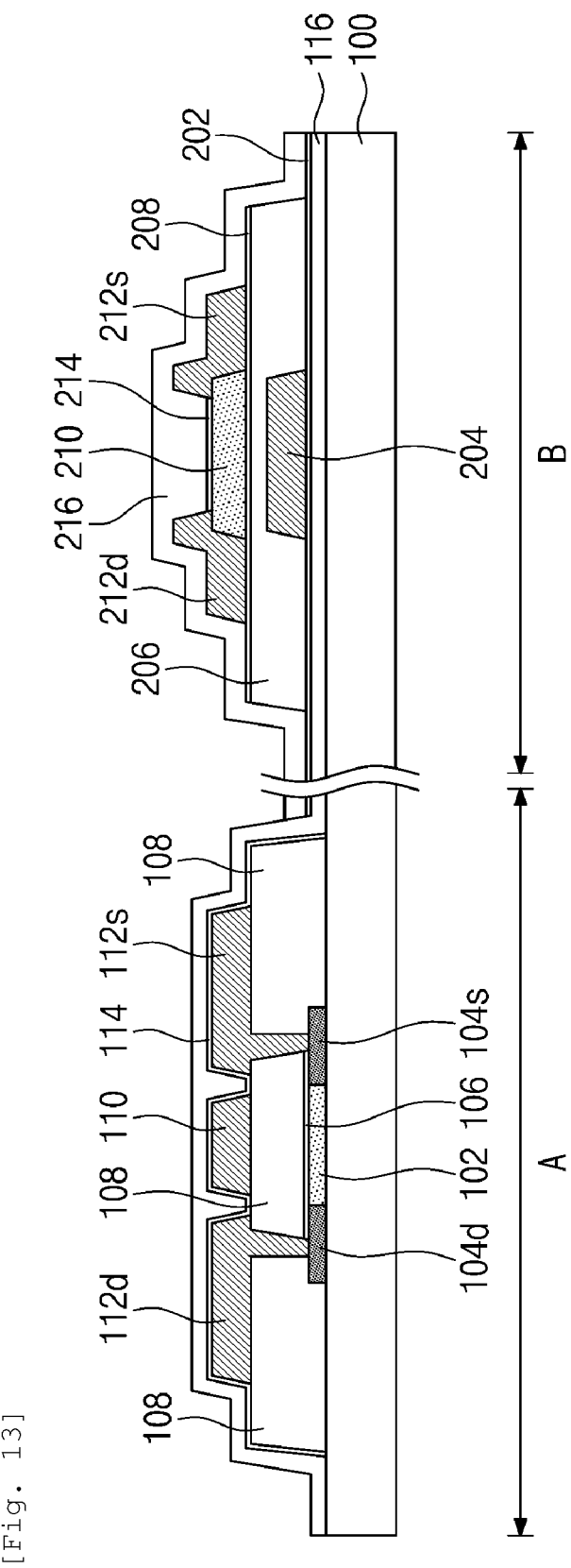
[Fig. 13]

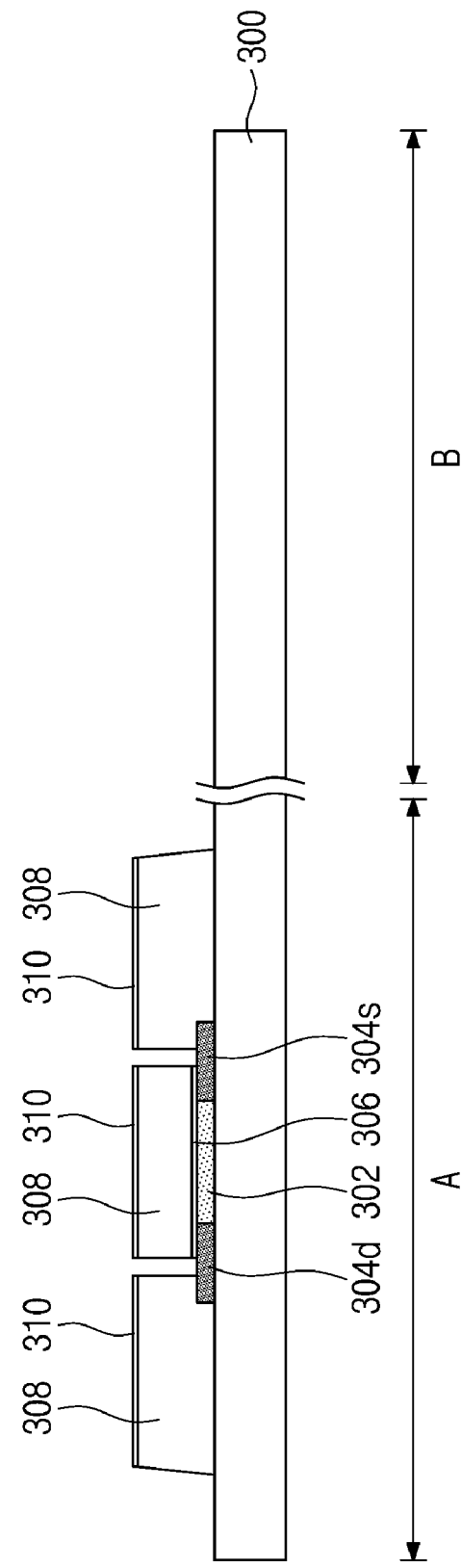
[Fig. 14]

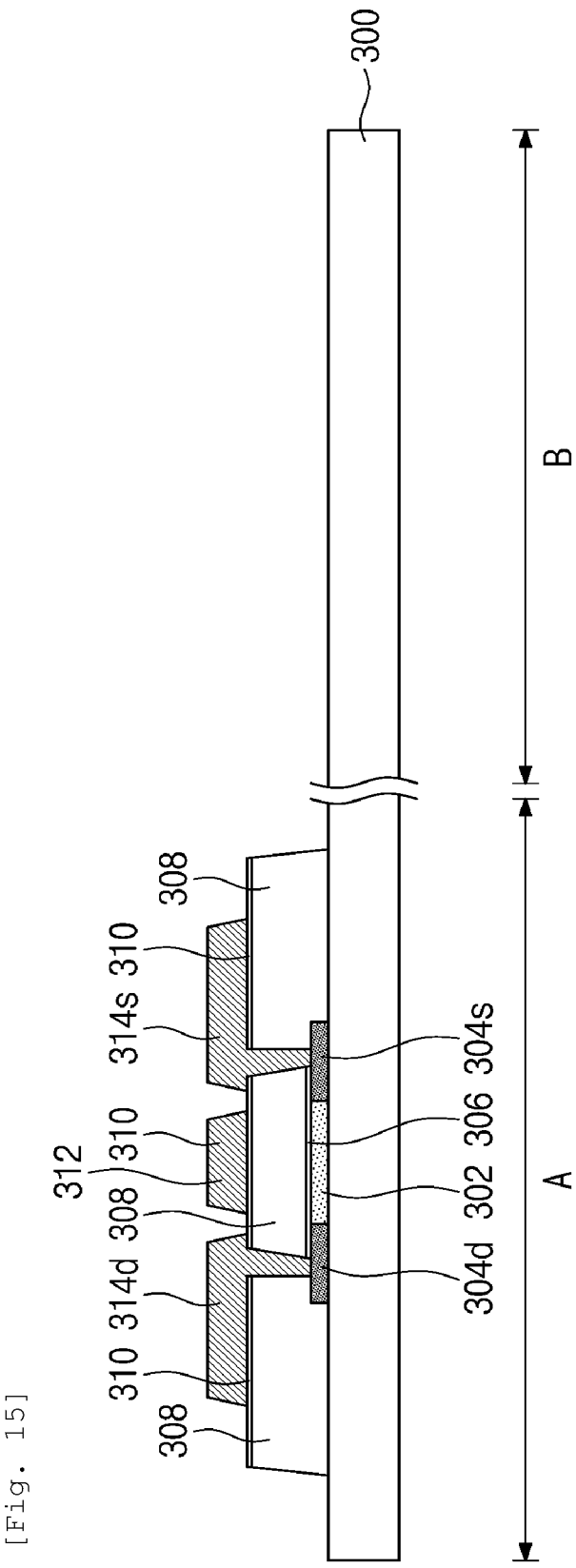
[Fig. 15]

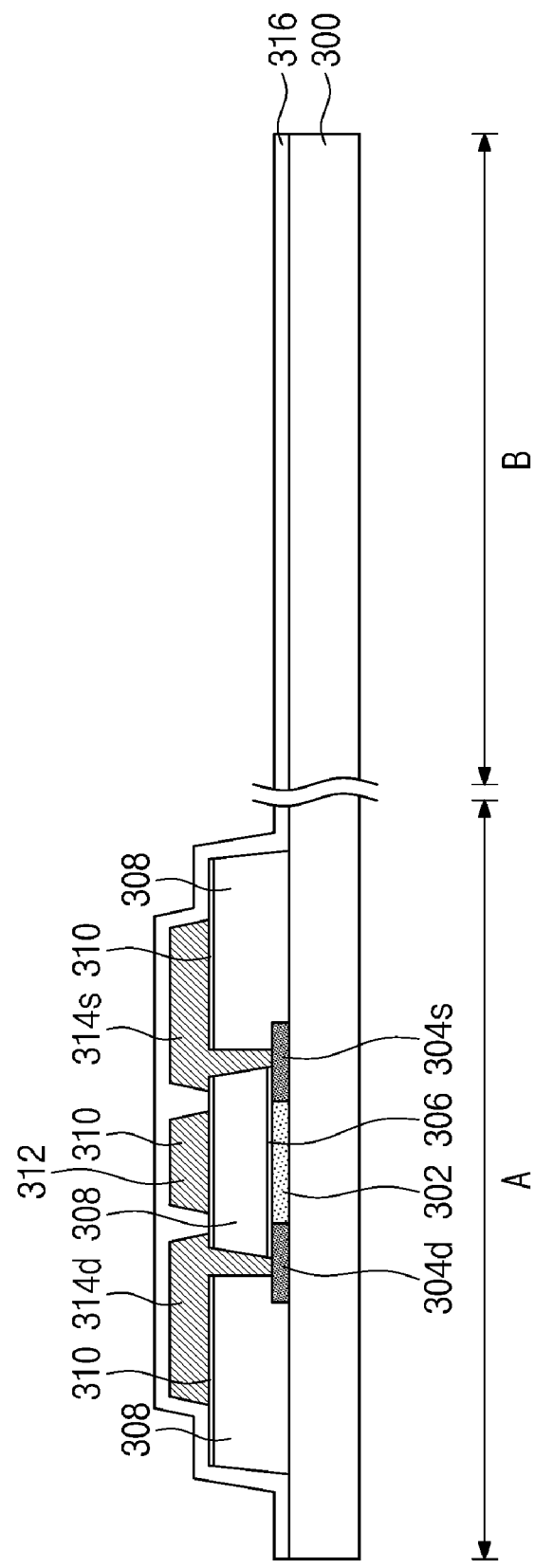

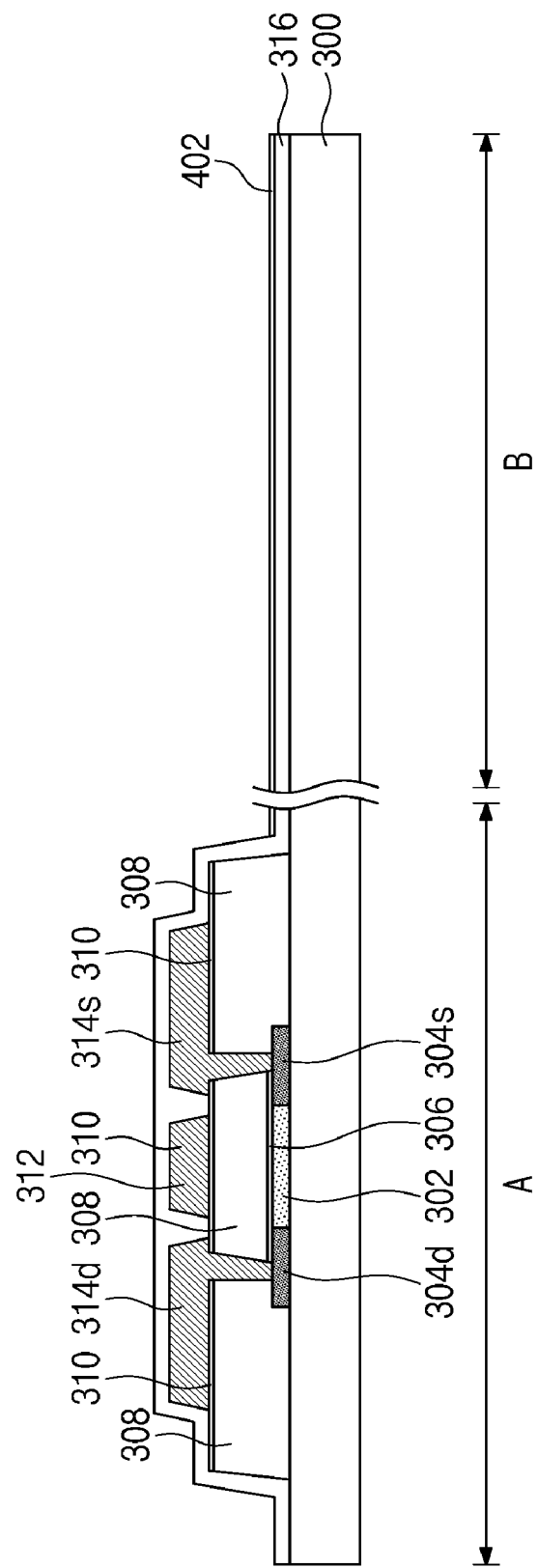

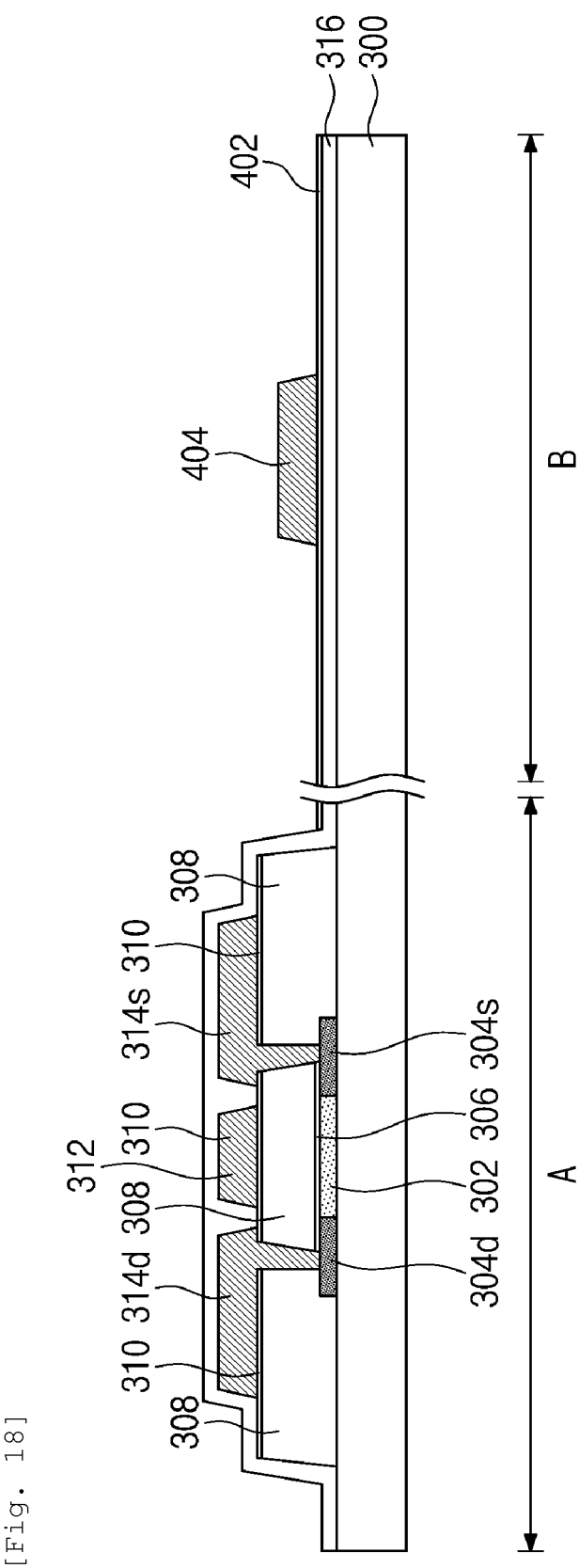

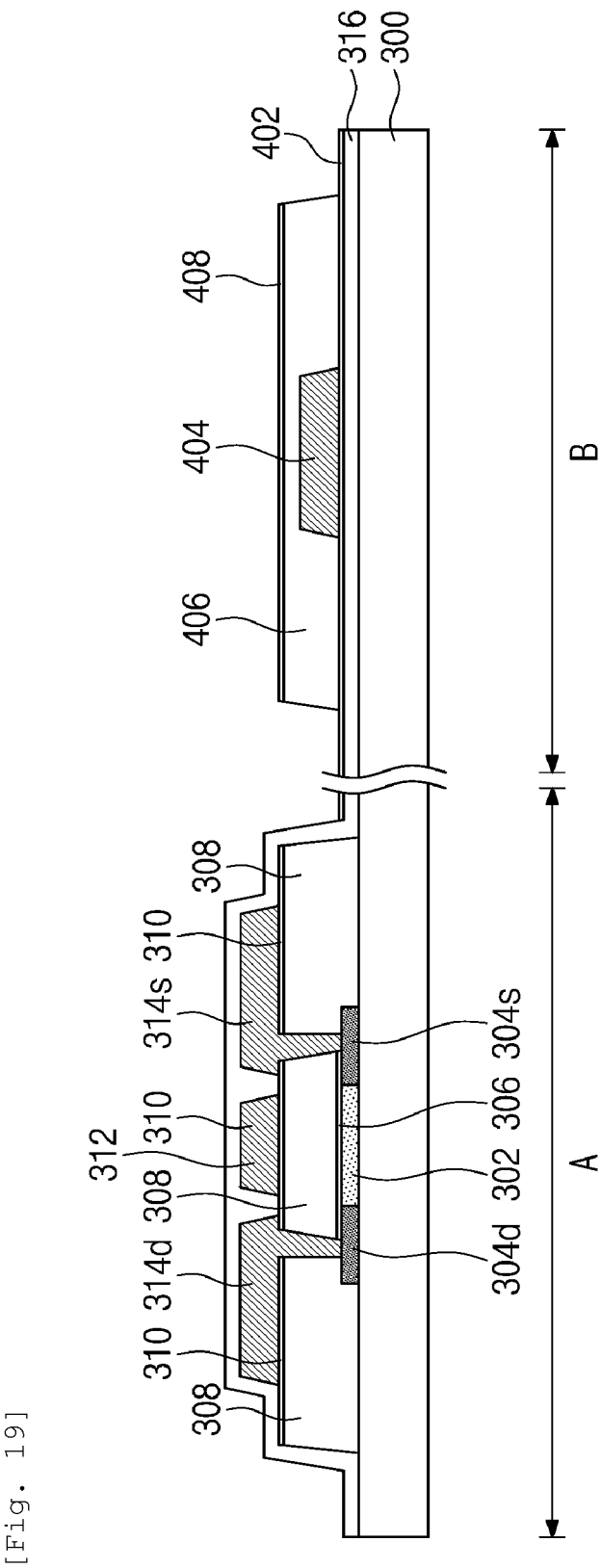
[Fig. 19]

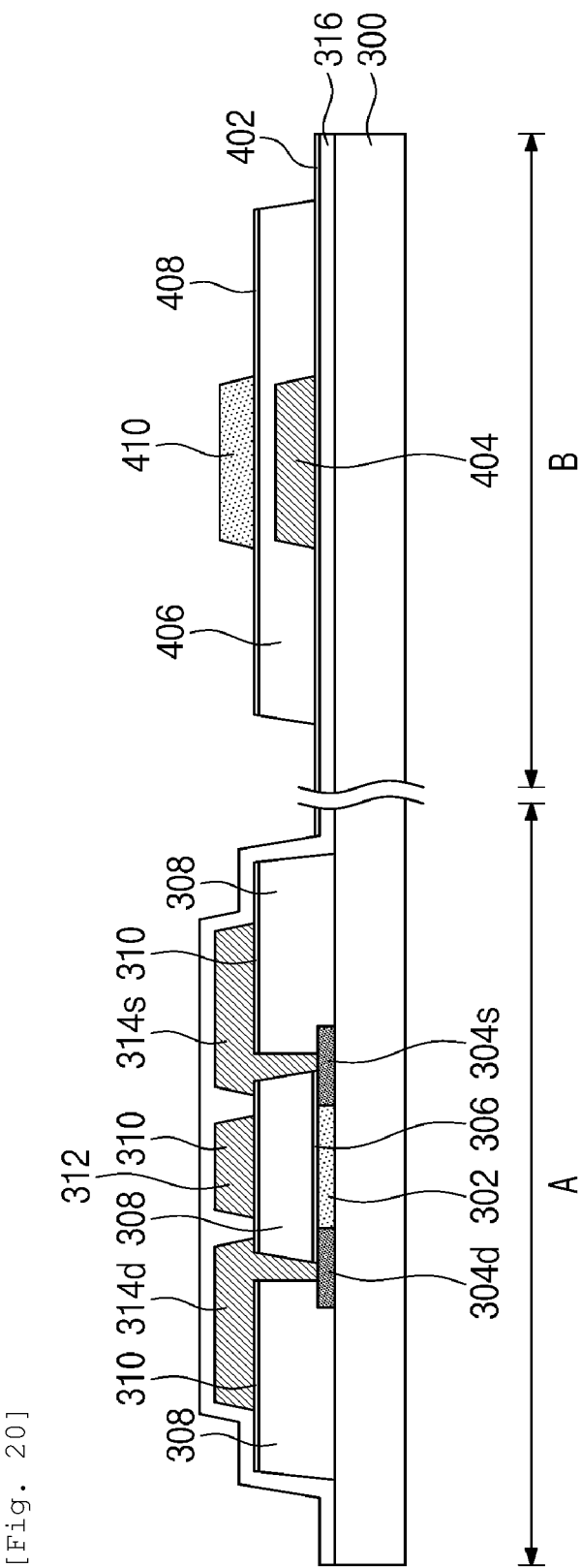

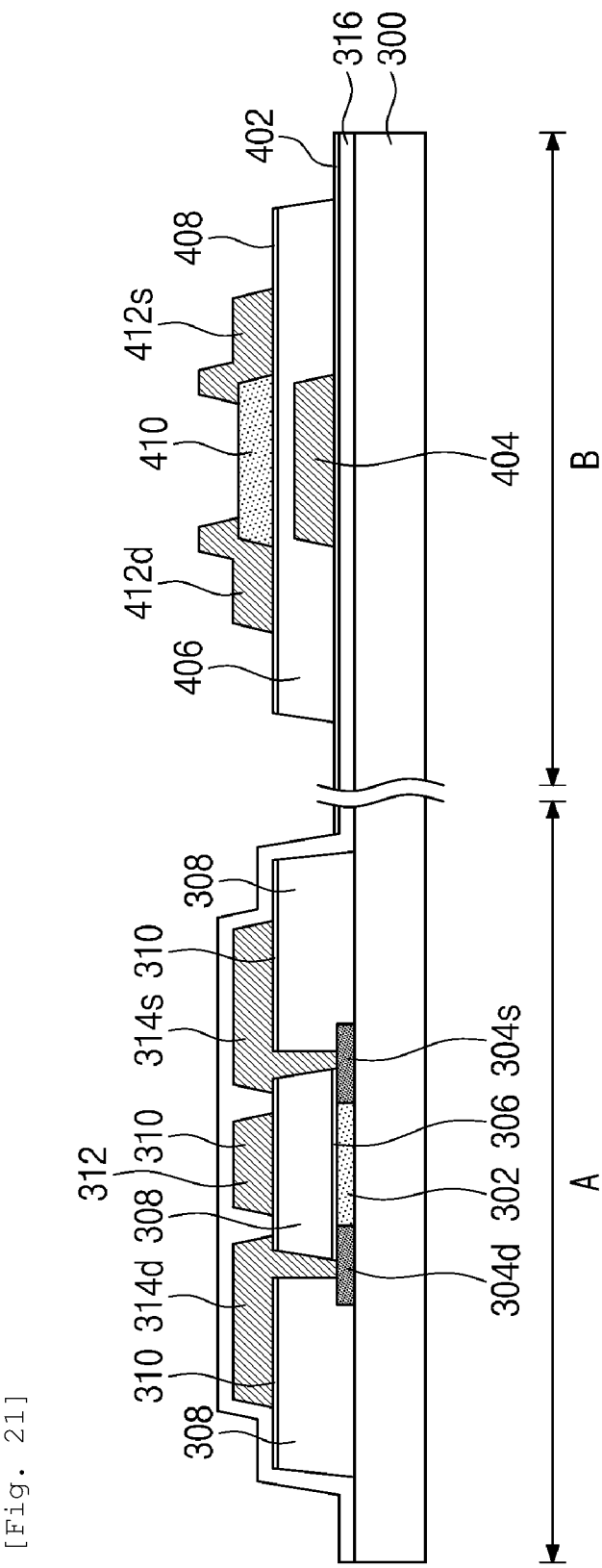

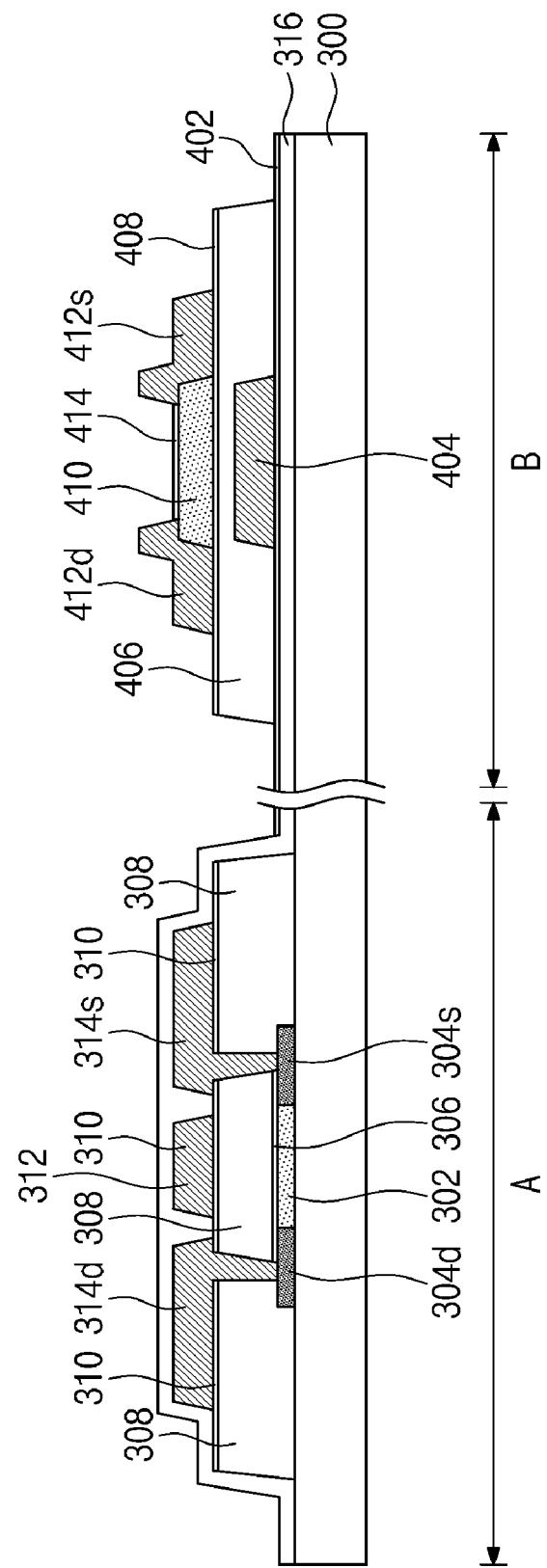
[Fig. 22]

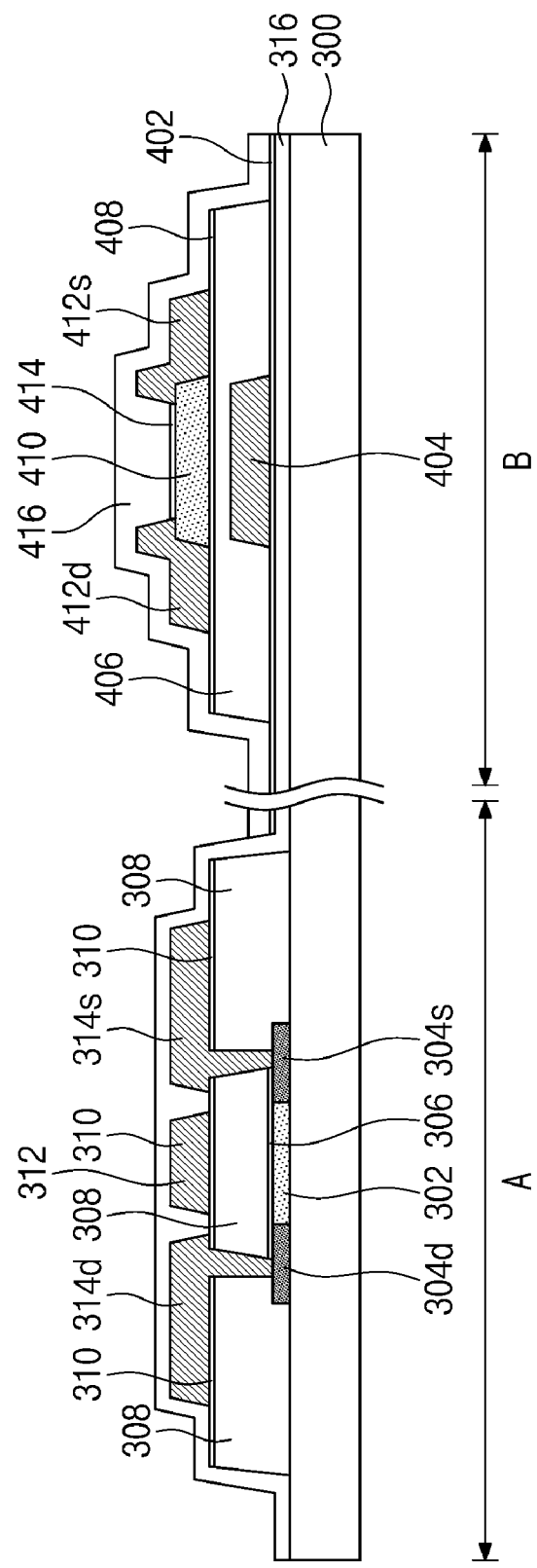
[Fig. 23]

[Fig. 24]
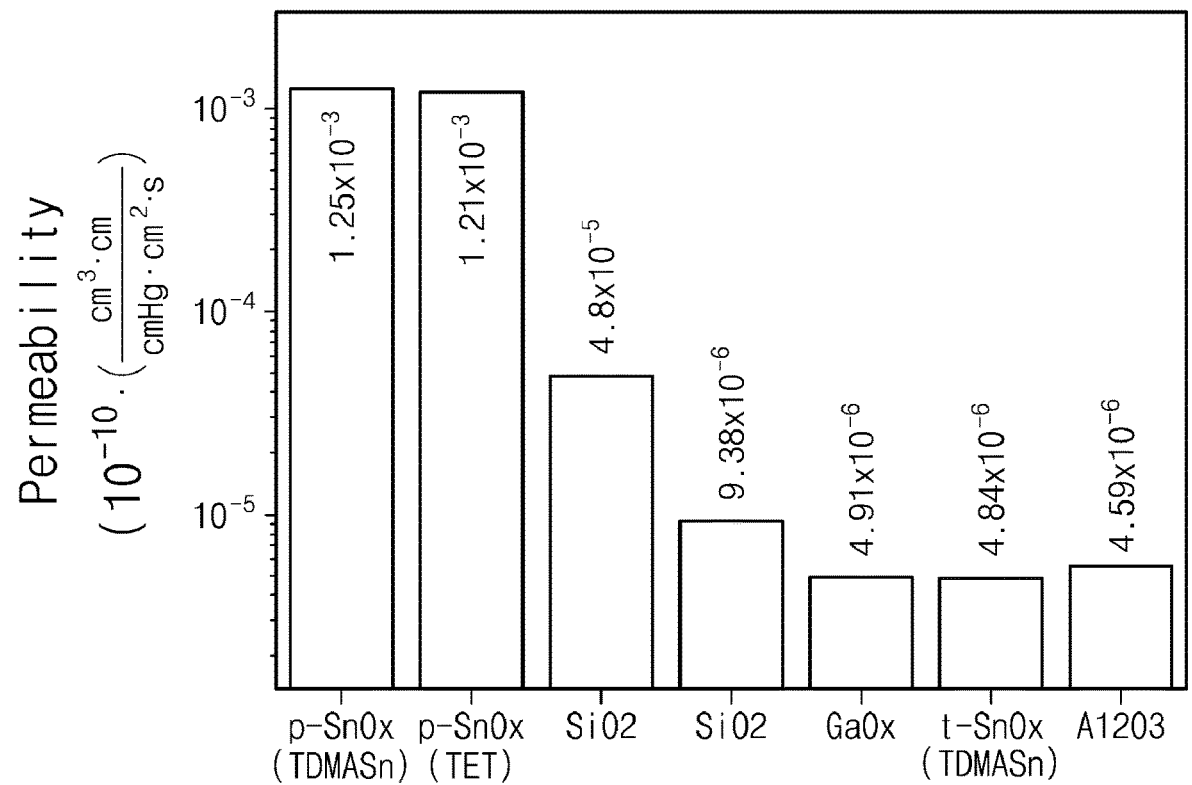

[Fig. 25]
(a)
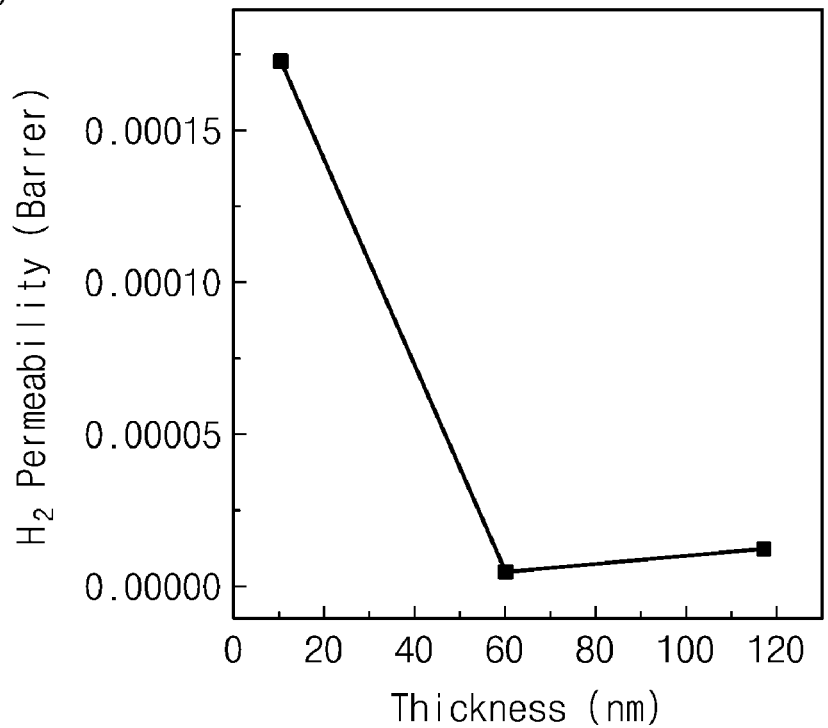
(b)
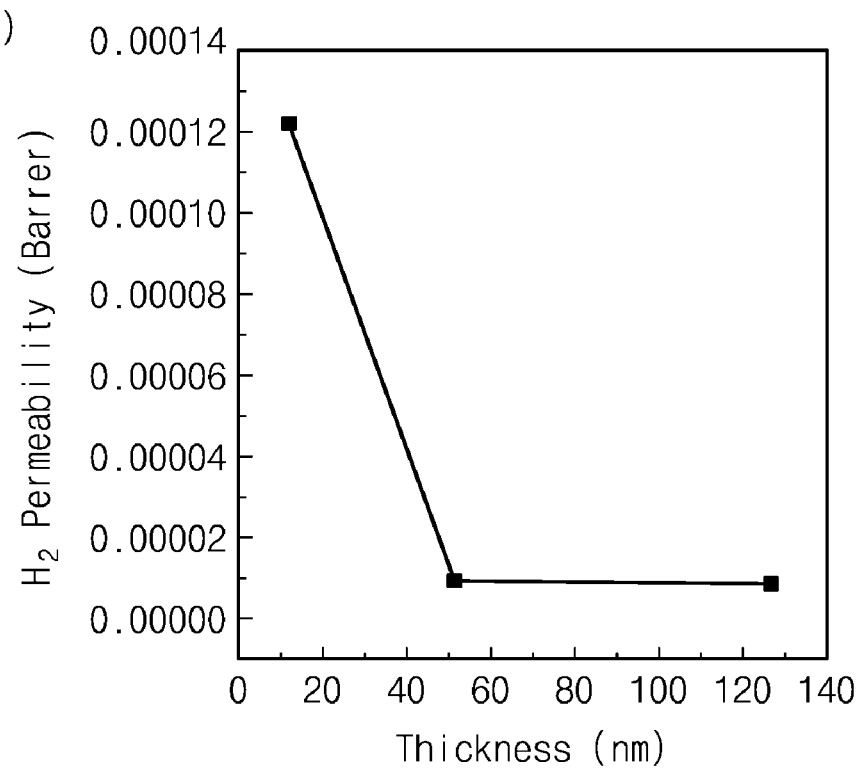

DISPLAY DEVICE INCLUDING HYDROGEN DIFFUSION BARRIER FILM, AND METHOD FOR MANUFACTURING SAME

CROSS REFERENCE TO RELATED APPLICATIONS

This application is a National Stage of International Application No. PCT/KR2020/004236 filed Mar. 27, 2020, claiming priority based on Korean Patent Application No. 10-2019-0041549 filed Apr. 9, 2019.

TECHNICAL FIELD

The present application relates to a display device and a method for manufacturing the same and, more particularly, to a display device including a hydrogen diffusion barrier film and a method for manufacturing the same.

BACKGROUND ART

Transistors are used in various electronic fields, such as circuit devices and driving devices of displays, memory devices such as DRAMs, and the like. Currently, a thin film of silicon oxide or silicon nitride manufactured by chemical vapor deposition (CVD) is mainly used as an insulating layer and a passivation layer of the transistor. The thin film manufactured as described above has a high content of hydrogen in the thin film. At this time, when hydrogen in the thin film moves to an active layer of the transistor, defects in the active layer are removed and a carrier concentration is increased to enhance the mobility of the transistor. However, when a high concentration of hydrogen moves into the active layer, the carrier concentration may be excessively increased and accordingly the transistor may lose on/off characteristics. Thus, research efforts have been made on the method for manufacturing a transistor to prevent hydrogen from being diffused from the insulating layer or the passivation layer to the active layer.

For example, Korean Unexamined Patent Publication No. 10-2013-0121655 (Application No. 10-2012-0116455) relates to a thin film transistor which includes a gate, an active layer, and a gate insulating layer disposed between the gate and the active layer, in which the active layer is an oxide semiconductor and the gate insulating layer includes at least one inorganic insulating thin film layer, in which the gate insulating layer is an insulating layer subjected to an annealing process.

Accordingly, there is disclosed a method for manufacturing a display device, an array substrate, and a thin film transistor in which the gate insulating layer of the thin film transistor effectively prevents adverse influences on the oxide semiconductor by hydrogen-containing groups.

DISCLOSURE

Technical Problem

One technical object of the present invention is to provide a display device and a method for manufacturing the same.

Another technical object of the present invention is to provide a display device including an oxide thin film with low hydrogen permeable properties and a method for manufacturing the same.

Still another technical object of the present invention is to provide a display device including a hydrogen diffusion barrier film having a small thickness manufactured by atomic layer deposition and a method for manufacturing the same.

Still another technical object of the present invention is to provide a display device including a thin film with a low off current and a method for manufacturing the same.

The technical objects of the present invention are not limited to the above.

Technical Solution

To solve the above technical objects, the present application may provide a display device.

According to one embodiment, the display device may include: a substrate including a driving area and a pixel area; a first transistor on the driving area; a second transistor on the pixel area; a first hydrogen diffusion barrier film between a first active layer and a first gate insulating film of the first transistor; and a second hydrogen diffusion barrier film between a second active layer and a second gate insulating film of the second transistor.

According to one embodiment, the first hydrogen diffusion barrier film and the second hydrogen diffusion barrier film may include at least any one of aluminum oxide, titanium oxide, tin oxide, gallium oxide, or silicon oxide.

According to one embodiment, the first transistor may include a first gate electrode, a first source electrode and a first drain electrode disposed on the first gate insulating film, and the display device may further include: a first insulating film disposed on the driving area including the first gate electrode, the first source electrode, and the first drain electrode; and a third hydrogen diffusion barrier film disposed between the first gate electrode, the first source electrode, the first drain electrode and the first insulating film.

According to one embodiment, the second transistor may include a second gate electrode, and the display device may further include: a first insulating film disposed between the second gate electrode of the second transistor and the substrate; and a fourth hydrogen diffusion barrier film disposed between the first insulating film and the second gate electrode.

According to one embodiment, the second transistor may include: a second active layer disposed on the fourth hydrogen diffusion barrier film; and the second source electrode and the second drain electrode, coming into contact with both sides of the second active layer disposed on the second gate insulating film, respectively and the display device may further include: a passivation film on the substrate including the second transistor; and a fifth hydrogen diffusion barrier film disposed between the second active layer and the passivation film.

To solve the above technical objects, the present application may provide a method for manufacturing a display device.

According to one embodiment, the method for manufacturing the display device may include: preparing a substrate including a driving area and a pixel area; forming a first transistor on the driving area; and forming a second transistor on the pixel area, in which a first hydrogen diffusion barrier film is provided between a first active layer and a first gate insulating film of the first transistor, and a second hydrogen diffusion barrier film is provided between a second active layer and a second gate insulating film of the second transistor.

According to one embodiment, the forming of the first transistor may include: forming a preliminary active layer on the driving area; forming the first active layer by crystallizing the preliminary active layer; forming the first hydrogen diffusion barrier film on the first active layer; forming the first gate insulating film on the first hydrogen diffusion barrier film formed on the driving area; forming a first gate electrode on the first gate insulating film disposed on the first active layer; and forming a first source electrode and a first drain electrode, passing through the first gate insulating film to come into contact with both sides of the first active layer.

According to one embodiment, there may be included: forming a third hydrogen diffusion barrier film on the first gate electrode, the first source electrode, and the first drain electrode, which are disposed on the first gate insulating film, after the manufacturing of the first transistor; forming a first insulating film on the driving area and the pixel area of the substrate after the forming of the third hydrogen diffusion barrier film; and forming a fourth hydrogen diffusion barrier film on the first insulating film formed on the pixel area.

According to one embodiment, the forming of the second transistor may include: forming a second gate electrode on the pixel area; forming the second gate insulating film on the second gate electrode formed on the pixel area; forming the second hydrogen diffusion barrier film on the second gate insulating film; forming the second active layer on the second hydrogen diffusion barrier film; and forming a second source electrode and a second drain electrode, coming into contact with both sides of the second active layer, on the second active layer formed on the second hydrogen diffusion barrier film.

According to one embodiment, there may be included: forming a fifth hydrogen diffusion barrier film on the second active layer after the manufacturing of the second transistor; and forming a passivation layer on the substrate including the first transistor and the second transistor.

According to one embodiment, the forming of the first hydrogen diffusion barrier film and the forming of the second hydrogen diffusion barrier film may be performed by thermal atomic layer deposition (ALD) or plasma atomic layer deposition (PEALD).

According to one embodiment, the forming of the first hydrogen diffusion barrier film and the forming of the second hydrogen diffusion barrier film may include: providing a precursor including a metal in a chamber; and providing a reaction gas, in which the metal may include at least any one of aluminum, titanium, tin, gallium, or silicon, and the reaction gas may include at least any one of nitrous oxide ($N_2O$) and oxygen ($O_2$).

According to one embodiment, the first hydrogen diffusion barrier film may come into contact with the first active layer, and the second hydrogen diffusion barrier film may come into contact with the second active layer, in which the first hydrogen diffusion barrier film and the second hydrogen diffusion barrier film may include a non-tin oxide.

Advantageous Effects

A display device according to an embodiment of the present invention may include: a substrate including a driving area and a pixel area; a first transistor on the driving area; a second transistor on the pixel area; a first hydrogen diffusion barrier film between a first active layer and a first gate insulating film of the first transistor; and a second hydrogen diffusion barrier film between a second active layer and a second gate insulating film of the second transistor.

The first hydrogen diffusion barrier film and the second hydrogen diffusion barrier film may be manufactured by plasma atomic layer deposition or thermal atomic layer deposition. In this case, the first hydrogen diffusion barrier film and the second hydrogen diffusion barrier film may include at least any one of aluminum oxide, titanium oxide, tin oxide, gallium oxide, or silicon oxide.

Accordingly, the first hydrogen diffusion barrier film and the second hydrogen diffusion barrier film, which are manufactured as described above, can have a small thickness and low hydrogen permeability. In this case, the first hydrogen diffusion barrier film and the second hydrogen diffusion barrier film can prevent hydrogen present in the gate insulating film from diffusing into the active layer. In other words, it is possible to prevent an increase in the concentration of the hydrogen in the active layer.

Unlike the above, if hydrogen is diffused into the active layer and thus the active layer includes a high concentration of hydrogen, the active layer may lose semiconductor properties. In other words, the transistor may lose on/off characteristics.

Thus, as described above, the first hydrogen diffusion barrier film and the second hydrogen diffusion barrier film can prevent a high concentration of hydrogen from being diffused into the active layer. Accordingly, a display device including a transistor having a low off-current property can be provided.

DESCRIPTION OF DRAWINGS

FIGS. 1 to 13 are sectional view showing a process for explaining a method for manufacturing a display device according to an embodiment of the present invention.

FIGS. 14 to 23 are sectional views showing a process for explaining a method for manufacturing a display device according to another embodiment of the present invention.

FIG. 24 is a graph showing a hydrogen permeability of a hydrogen diffusion barrier film according to an embodiment of the present invention.

FIG. 25 is a graph showing a hydrogen permeability depending on a thickness of a hydrogen diffusion barrier film according to an embodiment of the present invention.

MODE FOR INVENTION

Hereinafter, preferred embodiments of the present invention will be described in detail with reference to the accompanying drawings. However, the technical spirit of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element. Further, in the drawings, the thicknesses of the membrane and areas are exaggerated for efficient description of the technical contents.

Further, in the various embodiments of the present specification, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combinations thereof described in the specification are present, and are not to be understood as excluding the possibility that one or more other features, numbers, steps, elements, or combinations thereof may be present or added.

Further, in the following description of the present invention, a detailed description of known functions or configurations incorporated herein will be omitted when it may make the subject matter of the present invention unnecessarily unclear.

FIGS. 1 to 13 are sectional view showing a process for explaining a method for manufacturing a display device according to an embodiment of the present invention.

Referring to FIGS. 1 to 13, a substrate 100 including a driving area A and a pixel area B may be prepared. For example, the substrate may include a silicon semiconductor substrate, a compound semiconductor substrate, a metal substrate, a glass substrate, a plastic substrate, etc.

Referring to FIG. 1, a preliminary active layer may be formed on the driving area A. For example, the preliminary active layer may be amorphous silicon (a-Si). The preliminary active layer may be formed by plasma chemical vapor deposition (PECVD), low pressure chemical vapor deposition (LPCVD), sputtering, vacuum deposition, etc.

The first active layer 102 may be formed by crystallizing the preliminary active layer. For example, the first active layer 102 may be made of polysilicon (poly-Si) or single-crystal silicon.

The crystallizing of the preliminary active layer may be performed by an excimer laser annealing (ELA) method. In this case, an excimer laser may be provided on the preliminary active layer. Accordingly, the crystalline first active layer 102 may be formed by recrystallizing the preliminary active layer.

After forming the first active layer 102, doped areas 104s and 104d may be formed on both sides of the first active layer 102. The doped areas 104s and 104d may be manufactured by a patterning process and an ion implantation process. In this case, the doped areas 104s and 104d may be provided as a source area and a drain area, respectively.

Referring to FIG. 2, the first hydrogen diffusion barrier film 106 may be formed on the first active layer 102. In this case, the first hydrogen diffusion barrier film 106 may prevent hydrogen present in a gate insulating film 108 to be described below from diffusing into the first active layer 102.

According to one embodiment, the first hydrogen diffusion barrier film 106 may be formed of an insulating material. Accordingly, the first hydrogen diffusion barrier film 106 may prevent the first active layer 102 from being deteriorated by hydrogen diffusion without changing the semiconductor properties of the first active layer 102. For example, the first hydrogen diffusion barrier film 106 may include silicon oxide, titanium oxide, gallium oxide, aluminum oxide, etc.

According to another embodiment, the first hydrogen diffusion barrier film 106 may be formed of a conductive material. Specifically, for example, when the first hydrogen diffusion barrier film 106 includes tin oxide, indium oxide, etc., the semiconductor properties of the first active layer 102 may be changed. In this case, an insulating material layer may be further included between the first hydrogen diffusion barrier film 106 and the first active layer 102. Accordingly, the insulating material layer may prevent the semiconductor properties of the first active layer 102 from being changed.

According to one embodiment, the first hydrogen diffusion barrier film 106 may be formed by a reaction between a metal-containing precursor and a reactive gas. In this case, the metal may include at least any one of aluminum, titanium, tin, or gallium. In addition, the reaction gas may include at least any one of nitrous oxide ($N_2O$), oxygen ($O_2$), water ($H_2O$), hydrogen peroxide ($H_2O_2$), or ozone ($O_3$).

As described above, the first active layer 102 may be formed of a semiconductor material. Accordingly, the reaction gas may include a material that does not affect the semiconductor properties of the first active layer 102.

Unlike the above, the reaction gas may be, for example, water vapor ($H_2O$). In this case, the first active layer 102 may lose semiconductor properties and have conductivity due to the reaction gas.

Accordingly, the reaction gas may include a material that does not change the semiconductor properties of the first active layer 102. For example, the reaction gas may include nitrous oxide ($N_2O$), oxygen ($O_2$), etc.

According to one embodiment, the first hydrogen diffusion barrier film 106 may be manufactured by thermal atomic layer deposition (ALD). In this case, the reaction gas may react with the precursor adsorbed onto the substrate 100 by thermal energy. Accordingly, the first hydrogen diffusion barrier film 106 may be formed.

According to another embodiment, the first hydrogen diffusion barrier film 106 may be manufactured by plasma atomic layer deposition (PEALD). In this case, the reaction gas may be provided as a mixture gas mixed with an inert gas. In this case, plasma may be provided in the atmosphere provided with the mixture gas. The inert gas may assist in ignition of the plasma. Accordingly, the reaction gas may react with the precursor adsorbed onto the substrate 100 by the plasma, and the first hydrogen diffusion barrier film 106 may be formed.

Referring to FIG. 3, the first gate insulating film 108 may be formed on the first hydrogen diffusion barrier film 106. The first gate insulating film 108 may be formed of an insulating material. For example, the first gate insulating film 108 may include silicon oxide, silicon nitride, aluminum oxide, hafnium oxide, etc.

After the first gate insulating film 108 is formed, the first hydrogen diffusion barrier film 106 and the first gate insulating film 108 may be simultaneously patterned in the same shape by using a single mask. Accordingly, the number of masks used for the patterning may be reduced, and a process cost and process time may be reduced.

By the patterning, a via may be formed through the first gate insulating film 108 and the first hydrogen diffusion barrier film 106. Accordingly, the doped areas 104s and 104d may be exposed by the via.

Referring to FIG. 4, a first gate electrode 110, a first source electrode 112s, and a first drain electrode 112d may be formed on the first gate insulating film 108. In this case, the first gate electrode 110, the first source electrode 112s, and the first drain electrode 112d may be formed to be spaced apart from each other. At the same time, the first source electrode 112s and the first drain electrode 112d may come into contact with the doped areas 104s and 104d, respectively, through the via described above with reference to FIG. 3.

As described above with reference to FIGS. 1 to 4, a first transistor may be formed. In other words, the first transistor may include the first active layer 102, the first gate insulating film 108, the first gate electrode 110, the first source electrode 112s, and the first drain electrode 112d. In this case, a channel may be formed in the first active layer 102 by driving the first transistor.

Referring to FIG. 5, a third hydrogen diffusion barrier film 114 may be formed on the first transistor. In this case, the third hydrogen diffusion barrier film 114 may prevent hydrogen present in the first insulating film 116 from diffusing into the first transistor. Specifically, the third hydrogen diffusion barrier film 114 may be formed by a patterning process. Accordingly, the third hydrogen diffusion barrier film 114 may cover the first transistor and may not be formed on the pixel area B.

According to one modified example, the third hydrogen diffusion barrier film 114 may be formed without patterning. Accordingly, the third hydrogen diffusion barrier film 114 may be formed on the first transistor and the pixel area B.

The third hydrogen diffusion barrier film 114 may be formed by the same method as in the first hydrogen diffusion barrier film 106 described above with reference to FIG. 2. For example, the third hydrogen diffusion barrier film 114 may be formed by plasma atomic layer deposition (PEALD). In this case, the energy of the plasma may be lower in the forming of the first hydrogen diffusion barrier film 106 than in the forming of the third hydrogen diffusion barrier film 114.

Specifically, the first active layer 102 described above with reference to FIGS. 1 to 2 may be formed of a semiconductor material. If the energy of the plasma is high in the forming of the first hydrogen diffusion barrier film 106, the first material layer 102 may lose semiconductor properties and change into a conductive material.

In contrast, the first gate insulating film 108 described above with reference to FIGS. 3 to 4 may be formed of an insulating material, and the first gate electrode 110, the first source electrode 112s and the first drain electrode 112d may be formed of a conductive material. In this case, the first gate insulating film 108, the first gate electrode 110, the first source electrode 112s, and the first drain electrode 112d may not have material properties changed depending on the energy of plasma in the forming of the third hydrogen diffusion barrier film 114.

Thus, the energy of the plasma in the forming of the first hydrogen diffusion barrier film 106 may be lower than the energy of the plasma in the forming of the third hydrogen diffusion barrier film 114.

In addition, as described above, the third hydrogen diffusion barrier film 114 may come into contact with the first gate electrode 110, the first source electrode 112s, and the first drain electrode 112d, which include the metal material. Thus, the third hydrogen diffusion barrier film 114 may be formed of an insulating material. For example, the insulating material may include silicon oxide, titanium oxide, gallium oxide, aluminum oxide, etc.

Unlike the above, if the third hydrogen diffusion barrier film 114 is formed of a conductive material, the first gate electrode 110, the first source electrode 112s, and the first drain electrode 112d may be electrically connected to each other. Accordingly, the first gate electrode 110, the first source electrode 112s, and the first drain electrode 112d may be short-circuited. For example, the conductive material may include tin oxide, indium oxide, etc.

Thus, as described above, the third hydrogen diffusion barrier film 114 may be formed of the insulating material.

Accordingly, the third hydrogen diffusion barrier film 114 may prevent a short circuit between electrodes which form the first transistor.

Referring to FIG. 6, a first insulating film 116 may be formed on the third hydrogen diffusion barrier film 114 and the pixel area B. For example, the first insulating film 116 may include silicon oxide, silicon nitride, polymer, plastic, glass, etc.

Referring to FIG. 7, a fourth hydrogen diffusion barrier film 202 may be formed on the pixel area B. In this case, the fourth hydrogen diffusion barrier film 202 may prevent hydrogen present in the first insulating film 116 from diffusing into the second transistor to be described below.

In this case, the fourth hydrogen diffusion barrier film 202 may come into contact with the second gate electrode 204 to be described below. The second gate electrode 204 may be formed of a conductive material. Accordingly, the fourth hydrogen diffusion barrier film 202 may be formed of at least any one of the insulating materials described above with reference to FIG. 5. In addition, the fourth hydrogen diffusion barrier film 202 may be formed by the same method as in the third hydrogen diffusion barrier film 114 described above with reference to FIG. 5.

Specifically, the fourth hydrogen diffusion barrier film 202 may be formed by a patterning process. Accordingly, the fourth hydrogen diffusion barrier film 202 may be formed on the pixel area B and not on the driving area A.

According to one modified example, the fourth hydrogen diffusion barrier film 202 may be formed without patterning. Accordingly, the fourth hydrogen diffusion barrier film 202 may be formed on the first transistor and the pixel area B.

Referring to FIG. 8, a second gate electrode 204 may be formed on the first insulating film 116. As described above, the second gate electrode 204 may be formed of a conductive material. For example, the conductive material may include copper, aluminum, molybdenum, etc.

Referring to FIG. 9, a second gate insulating film 206 may cover the second gate electrode 204 and may be formed on the first insulating film 116. For example, the second gate insulating film 206 may be at least any one of the insulating materials described above with reference to FIG. 3.

A second hydrogen diffusion barrier film 208 may be formed on the second gate insulating film 206. In this case, the second hydrogen diffusion barrier film 208 may prevent hydrogen present in the second gate insulating film 206 from diffusing into the second active layer 210 to be described below.

In this case, the second hydrogen diffusion barrier film 208 may come into contact with the second active layer 210. The second active layer 210 may be formed of a semiconductor material. Accordingly, the second hydrogen diffusion barrier film 208 may be formed of at least any one of the insulating materials described above with reference to FIG. 2. In addition, the second hydrogen diffusion barrier film 208 may be formed by the same method as in the first hydrogen diffusion barrier film 106 described above with reference to FIG. 2.

After forming the second hydrogen diffusion barrier film 208, the second gate insulating film 206 and the second hydrogen diffusion barrier film 208 may be simultaneously patterned in the same shape. Accordingly, as described above with reference to FIG. 3, the number of masks used for the patterning may be reduced, and a process cost and process time may be reduced.

Referring to FIG. 10, the second active layer 210 may be formed on the second hydrogen diffusion barrier film 208. As described above, the second active layer 210 may be formed of a semiconductor material. For example, the semiconductor material may be an oxide semiconductor. In addition, for example, the oxide semiconductor may include zinc, indium, gallium, tin, titanium, etc.

Referring to FIG. 11, the second source electrode 212s and the second drain electrode 212d may be spaced apart from each other and formed on the second hydrogen diffusion barrier film 208. At the same time, the second source electrode 212s and the second drain electrode 212d may come into contact with both sides of the second active layer 210, respectively. The second source electrode 212s and the second drain electrode 212d may be formed of a conductive material. For example, the conductive material may include aluminum, gold, silver, copper, molybdenum, chromium, titanium, tantalum, etc.

As described above with reference to FIGS. 8 to 11, a second transistor may be formed. In other words, the second transistor may include the second active layer 210, the second gate insulating film 206, the second gate electrode 204, the second source electrode 212s, and the second drain electrode 212d. In this case, as described above with reference to FIGS. 1 to 4, a channel may be formed inside the second active layer 210.

Referring to FIG. 12, the fifth hydrogen diffusion barrier film 214 may be formed on the second active layer 210. Specifically, the fifth hydrogen diffusion barrier film 214 may be provided on the second active layer 210 by a patterning process. In this case, the fifth hydrogen diffusion barrier film 214 may prevent hydrogen present in a passivation layer 216 to be described below from diffusing into the second active layer 210.

According to one modified example, the fifth hydrogen diffusion barrier film 214 may be formed without the patterning. Accordingly, the fifth hydrogen diffusion barrier film 214 may be formed on the first transistor and the second transistor.

In this case, the fifth hydrogen diffusion barrier film 214 may come into contact with the second active layer 210. Thus, the fifth hydrogen diffusion barrier film 214 may be formed of at least any one of the insulating materials described above with reference to FIG. 9. In addition, the fifth hydrogen diffusion barrier film 214 may be formed by the same method as in the second hydrogen diffusion barrier film 208 described above with reference to FIG. 9.

For example, the fifth hydrogen diffusion barrier film 214 may be formed by plasma atomic layer deposition (PEALD). In this case, the energy of the plasma may be lower in the forming of the fifth hydrogen diffusion barrier film 214 than in the forming of the fourth hydrogen diffusion barrier film 202 described above with reference to FIG. 7.

Specifically, the second active layer 210 described above with reference to FIG. 10 may be formed of a semiconductor material. If the energy of the plasma is high in the forming of the fifth hydrogen diffusion barrier film 214, the second active layer 210 may lose semiconductor properties and change into a conductive material.

In contrast, the fourth hydrogen diffusion barrier film 202 may come into contact with the second gate electrode 204 and the second gate insulating film 206. In this case, the second gate electrode 204 may be formed of a conductive material, and the second gate insulating film 206 may be formed of an insulating material. Accordingly, the second gate electrode 204 and the second gate insulating film 206 may not have material properties changed depending on the energy of the plasma in the forming of the fourth hydrogen diffusion barrier film 202.

Thus, as described above, the energy of the plasma may be lower in the forming of the fifth hydrogen diffusion barrier film 214 than the energy of the plasma in the forming of the fourth hydrogen diffusion barrier film 202.

Referring to FIG. 13, the passivation layer 216 may be formed on the first transistor and the second transistor. The passivation layer 216 may be formed of an insulating material. For example, the insulating material may include silicon oxide, silicon nitride, glass, polymer, etc.

There may be provided a display device including the first transistor, the second transistor, the first hydrogen diffusion barrier film 106, the second hydrogen diffusion barrier film 208, the third hydrogen diffusion barrier film 114, the fourth hydrogen diffusion barrier film 202, and the fifth hydrogen diffusion barrier film 214.

The first hydrogen diffusion barrier film 106 may be provided between the first active layer 102 and the first gate insulating film 108. Accordingly, the first hydrogen diffusion barrier film 106 may prevent hydrogen present in the first gate insulating film 108 from diffusing into the first active layer 102. In addition, the third hydrogen diffusion barrier film 114 may be provided between the first transistor and the first insulating film 116 covering the first transistor. Accordingly, the third hydrogen diffusion barrier film 114 may prevent hydrogen present in the first insulating film 116 from diffusing into the first transistor. In other words, the first hydrogen diffusion barrier film 106 and the third hydrogen diffusion barrier film 114 may directly or indirectly prevent the hydrogen in the first active layer 102 from increasing to a high concentration. Accordingly, the first transistor may maintain an on/off characteristic and exhibit a low off-current characteristic.

The second hydrogen diffusion barrier film 208 may be provided between the second active layer 210 and the second gate insulating film 206. The fifth hydrogen diffusion barrier film 214 may be provided between the second active layer 210 and the passivation layer 216 covering the second transistor. Accordingly, the second hydrogen diffusion barrier film 208 and the fifth hydrogen diffusion barrier film 214 may prevent hydrogen present in each of the second gate insulating film 206 and the passivation layer 216 from diffusing into the second active layer 210. In addition, the fourth hydrogen diffusion barrier film 202 may be provided between the first insulating film 116 and the second gate electrode 204 of the second transistor. Accordingly, the fourth hydrogen diffusion barrier film 202 may prevent hydrogen present in the first insulating film 116 from diffusing into the second transistor. In other words, the second hydrogen diffusion barrier film 208, the fourth hydrogen diffusion barrier film 202, and the fifth hydrogen diffusion barrier film 214 may directly or indirectly prevent the hydrogen in the second active layer 210 from increasing to a high concentration. Accordingly, the second transistor may maintain an on/off characteristic and exhibit a low off-current characteristic.

In addition, according to one embodiment, the first hydrogen diffusion barrier film 106, the second hydrogen diffusion barrier film 208, the third hydrogen diffusion barrier film 114, the fourth hydrogen diffusion barrier film 202, and the fifth hydrogen diffusion barrier film 214 may include aluminum oxide, titanium oxide, tin oxide, gallium oxide, silicon oxide, etc.

Specifically, for example, the first hydrogen diffusion barrier film 106, the second hydrogen diffusion barrier film 208, the third hydrogen diffusion barrier film 114, the fourth hydrogen diffusion barrier film 202, and the fifth hydrogen diffusion barrier film 214 may include tin oxide or titanium oxide. In this case, if the thickness of the first hydrogen diffusion barrier film 106, the second hydrogen diffusion barrier film 208, the third hydrogen diffusion barrier film 114, the fourth hydrogen diffusion barrier film 202, and the fifth hydrogen diffusion barrier film 214 is less than 60 nm, the hydrogen permeability may be high. In contrast, if the thickness of the first hydrogen diffusion barrier film 106, the second hydrogen diffusion barrier film 208, the third hydrogen diffusion barrier film 114, the fourth hydrogen diffusion barrier film 202, and the fifth hydrogen diffusion barrier film 214 is 60 nm or more, the hydrogen permeability may be low and a change amount of the hydrogen permeability may be small depending on the thickness. Thus, the thickness of the first hydrogen diffusion barrier film 106, the second hydrogen diffusion barrier film 208, the third hydrogen diffusion barrier film 114, the fourth hydrogen diffusion barrier film 202, and the fifth hydrogen diffusion barrier film 214 may be 60 nm or more.

FIGS. 14 to 23 are sectional views showing a process for explaining a method for manufacturing a display device according to another embodiment of the present invention.

Referring to FIG. 14, the first active layer 302 may be formed on the substrate 300. In this case, doped areas 304s and 304d may be formed in contact with both sides of the first active layer 302. After the doped areas 304s and 304d are formed, a first hydrogen diffusion barrier film 306 may be formed on the first active layer 302. In this case, the first active layer 302, the doped areas 304s and 304d, and the first hydrogen diffusion barrier film 206 may correspond to the first active layer 102, the doped areas 104s and 104d, and the first hydrogen diffusion barrier film 106 described above with reference to FIGS. 1 to 2. Thus, the forming of the first active layer 302, the forming of the doped areas 304s and 304d, and the forming of the first hydrogen diffusion barrier film 306 may be performed in the same way as described above with reference to FIGS. 1 to 2.

A first gate insulating film 308 may be formed on the first hydrogen diffusion barrier film 306. The first gate insulating film 308 may be formed of an insulating material. For example, the first gate insulating film 308 may include silicon oxide, silicon nitride, aluminum oxide, hafnium oxide, etc.

A sixth hydrogen diffusion barrier film 310 may be formed on the first gate insulating film 308. In this case, the sixth hydrogen diffusion barrier film 310 may prevent hydrogen present in the first gate insulating film 208 from diffusing into a first gate electrode 312, a first source electrode 314s, and a first drain electrode 314d to be described below.

The sixth hydrogen diffusion barrier film 310 may be formed of an insulating material. For example, the insulating material may include silicon oxide, titanium oxide, gallium oxide, aluminum oxide, etc.

Unlike the above, the sixth hydrogen diffusion barrier film 310 may be formed of an insulating material. Specifically, for example, if the sixth hydrogen diffusion barrier film 310 is tin oxide or indium oxide, the first gate electrode 312, the first source electrode 314s, and the first drain electrode 314d may be electrically connected to each other.

Thus, as described above, the sixth hydrogen diffusion barrier film 310 may be formed of the insulating material. Accordingly, the first gate electrode 312, the first source electrode 314s, and the first drain electrode 314d, which come into contact with the sixth hydrogen diffusion barrier film 310, may be prevented from having a short circuit.

In addition, the sixth hydrogen diffusion barrier film 310 may be formed by the same method as in the first hydrogen diffusion barrier film 306 described above with reference to FIG. 14. For example, the sixth hydrogen diffusion barrier film 310 may be formed by plasma atomic layer deposition (PEALD). In this case, as described above, the first hydrogen diffusion barrier film 306 may come into contact with the first active layer 302 and the sixth hydrogen diffusion barrier film 310 may be formed in contact with the first gate insulating layer 308. Accordingly, the energy of the plasma may be performed in a range in which material properties of the first active layer 302 and the first gate insulating layer 308 do not change.

For example, if the energy of the plasma is high, the first active layer 302 may lose semiconductor properties and change into a conductive material. In contrast, the first gate insulating layer 308 may not have material properties changed depending on the energy of the plasma. Thus, the energy of the plasma may be lower in the forming of the first hydrogen diffusion barrier film 306 than in the forming of the sixth hydrogen diffusion barrier film 310.

After the sixth hydrogen diffusion barrier film 310 is formed, the first hydrogen diffusion barrier film 306, the first gate insulating film 308, and the sixth hydrogen diffusion barrier film 310 may be simultaneously patterned in the same shape. Accordingly, the time and cost required for the patterning process may be reduced.

In this case, by the patterning, a via may be formed through the first hydrogen diffusion barrier film 306, the first gate insulating film 308, and the sixth hydrogen diffusion barrier film 310. Accordingly, the doped areas 304s and 304d may be exposed by the via.

Referring to FIG. 15, a first gate electrode 312, a first source electrode 314s, and a first drain electrode 314d may be formed on the sixth hydrogen diffusion barrier film 310. In this case, the first gate electrode 312, the first source electrode 314s, and the first drain electrode 314d may be formed to be spaced apart from each other. At the same time, the first source electrode 314s and the first drain electrode 314d may come into contact with the doped areas 304s and 304d, respectively, through the via.

As described above with reference to FIGS. 14 to 15, a first transistor may be formed. In other words, the first transistor may include the first active layer 302, the first gate insulating film 308, the first gate electrode 312, the first source electrode 314s, and the first drain electrode 314d. In this case, a channel may be formed in the first active layer 302 by driving the first transistor.

Referring to FIG. 16, a first insulating film 316 may be formed on the first transistor and the pixel area B. For example, the first insulating film 316 may include silicon oxide, silicon nitride, polymer, plastic, glass, etc.

Referring to FIG. 17, a fourth hydrogen diffusion barrier film 402 may be formed on the pixel area B. Accordingly, the fourth hydrogen diffusion barrier film 402 may prevent hydrogen present in the first insulating film 316 from diffusing into the second gate electrode 404 to be described below. In this case, the fourth hydrogen diffusion barrier film 402 may correspond to the fourth hydrogen diffusion barrier film 202 described above with reference to FIG. 7. Accordingly, the forming of the fourth hydrogen diffusion barrier film 402 may be performed in the same way as described above with reference to FIG. 7.

Referring to FIG. 18, the second gate electrode 404 may be formed on the first insulating film 316. The second gate electrode 404 may be formed of a conductive material. For example, the conductive material may include copper, aluminum, molybdenum, etc.

Referring to FIG. 19, a second gate insulating film 406 may cover the second gate electrode 404 and may be formed on the first insulating film 316 at the same time. After forming the second gate insulating film 406, a second hydrogen diffusion barrier film 408 may be formed on the second gate insulating film 406. In this case, the second hydrogen diffusion barrier film 408 may prevent hydrogen present in the second gate insulating film 406 from diffusing into the second active layer 410 to be described below.

Specifically, the second gate insulating film 406 and the second hydrogen diffusion barrier film 408 may correspond to each of the second insulating film 206 and the second hydrogen diffusion barrier film 208 described above with reference to FIG. 9. Accordingly, the forming of the second gate insulating film 406 and the forming of the second hydrogen diffusion barrier film 408 may be performed in the same way as described above with reference to FIG. 9.

After forming the second hydrogen diffusion barrier film 408, the second gate insulating film 406 and the second hydrogen diffusion barrier film 408 may be simultaneously patterned in the same shape. Accordingly, the number of masks used for the patterning may be reduced, and thus the time and cost required for the patterning process may be reduced.

Referring to FIG. 20, the second active layer 410 may be formed on the second hydrogen diffusion barrier film 408. The second active layer 410 may be formed of a semiconductor material. For example, the semiconductor material may be an oxide semiconductor. For example, the oxide semiconductor may include zinc, indium, gallium, tin, titanium, etc.

Referring to FIG. 21, the second source electrode 412s and the second drain electrode 412d may be spaced apart from each other and formed on the second hydrogen diffusion barrier film 408. At the same time, the second source electrode 412s and the second drain electrode 412d may come into contact with both sides of the second active layer 410, respectively. The second source electrode 412s and the second drain electrode 412d may be formed of a conductive material. For example, the conductive material may include aluminum, gold, silver, copper, molybdenum, chromium, titanium, tantalum, etc.

As described above with reference to FIGS. 18 to 21, a second transistor may be formed. In other words, the second transistor may include the second active layer 410, the second gate insulating film 406, the second gate electrode 404, the second source electrode 412s, and the second drain electrode 412d. Accordingly, the second transistor may correspond to the second transistor described above with reference to FIGS. 8 to 11.

Referring to FIG. 22, the fifth hydrogen diffusion barrier film 414 may be formed on the second active layer 410. In this case, the fifth hydrogen diffusion barrier film 214 may prevent hydrogen present in a passivation layer 416 to be described below from diffusing into the second active layer 210. In this case, the fifth hydrogen diffusion barrier film 414 may correspond to the fifth hydrogen diffusion barrier film 214 described above with reference to FIG. 12. Accordingly, the forming of the fifth hydrogen diffusion barrier film 414 may be performed in the same way as described above with reference to FIG. 12.

For example, the fifth hydrogen diffusion barrier film 414 may be formed by plasma atomic layer deposition (PEALD). In this case, the energy of the plasma may be lower in the forming of the fifth hydrogen diffusion barrier film 414 than in the forming of the fourth hydrogen diffusion barrier film 402 described above with reference to FIG. 17.

As described above, the fifth hydrogen diffusion barrier film 414 may come into contact with the second active layer 410 and the fourth hydrogen diffusion barrier film 402 may come into contact with the second gate electrode 404 and the second gate insulating film 404. In this case, the second active layer 410 may lose semiconductor properties and change into a conductive material depending on the energy of the plasma. In contrast, the second gate electrode 404 and the second gate insulating film 406 may not have material properties changed depending on the energy of the plasma.

Thus, as described above with reference to FIG. 12, the energy of the plasma may be higher in the forming of the fifth hydrogen diffusion barrier film 414 than the energy of the plasma in the forming of the fourth hydrogen diffusion barrier film 402.

Referring to FIG. 23, the passivation layer 416 may be formed on the first transistor and the second transistor. The passivation layer 416 may be formed of an insulating material. For example, the insulating material may include silicon oxide, silicon nitride, glass, polymer, etc.

There may be provided a display device including the first transistor, the second transistor, the first hydrogen diffusion barrier film 306, the second hydrogen diffusion barrier film 408, the fourth hydrogen diffusion barrier film 402, the fifth hydrogen diffusion barrier film 414, and the sixth hydrogen diffusion barrier film 310.

The first hydrogen diffusion barrier film 306 may be provided between the first active layer 302 and the first gate insulating film 308. The sixth hydrogen diffusion barrier film 310 may be provided between the first gate insulating film 308, the first gate electrode 312, the first source electrode 314s, and the first drain electrode 314d. Accordingly, the first hydrogen diffusion barrier film 306 and the sixth hydrogen diffusion barrier film 310 may prevent hydrogen present in the first gate insulating film 308 from diffusing into the electrodes which form the first active layer 302 and the first transistor. In other words, the first hydrogen diffusion barrier film 306 and the sixth hydrogen diffusion barrier film 310 may directly or indirectly prevent the hydrogen in the first active layer 302 from increasing to a high concentration. Accordingly, the first transistor may maintain an on/off characteristic and exhibit a low off-current characteristic.

The second hydrogen diffusion barrier film 408, the fourth hydrogen diffusion barrier film 402, and the fifth hydrogen diffusion barrier film 414 may correspond to the second hydrogen diffusion barrier film 208, the fourth hydrogen diffusion barrier film 202, and the fifth hydrogen diffusion barrier film 214 described above with reference to FIGS. 6 to 13, respectively. Accordingly, the second hydrogen diffusion barrier film 408, the fourth hydrogen diffusion barrier film 402, and the fifth hydrogen diffusion barrier film 414 may directly or indirectly prevent the hydrogen in the second active layer 410 from increasing to a high concentration. Accordingly, the second transistor may maintain an on/off characteristic and exhibit a low off-current characteristic.

The first hydrogen diffusion barrier film 306, the second hydrogen diffusion barrier film 408, the fourth hydrogen diffusion barrier film 402, the fifth hydrogen diffusion barrier film 414, and the sixth hydrogen diffusion barrier film 310 may include aluminum oxide, titanium oxide, tin oxide, gallium oxide, silicon oxide, etc.

Specifically, for example, the first hydrogen diffusion barrier film 306, the second hydrogen diffusion barrier film 408, the fourth hydrogen diffusion barrier film 402, the fifth hydrogen diffusion barrier film 414, and the sixth hydrogen diffusion barrier film 310 may include tin oxide or titanium oxide. In this case, if the thickness of the first hydrogen diffusion barrier film 306, the second hydrogen diffusion barrier film 408, the fourth hydrogen diffusion barrier film 402, the fifth hydrogen diffusion barrier film 414, and the sixth hydrogen diffusion barrier film 310 is less than 60 nm, the hydrogen permeability may be high. In contrast, if the thickness of the first hydrogen diffusion barrier film 306, the second hydrogen diffusion barrier film 408, the fourth hydrogen diffusion barrier film 402, the fifth hydrogen diffusion barrier film 414, and the sixth hydrogen diffusion barrier film 310 is 60 nm or more, the hydrogen permeability may be low and a change amount of the hydrogen permeability may be small depending on the thickness. Thus, the thickness of the first hydrogen diffusion barrier film 306, the second hydrogen diffusion barrier film 408, the fourth hydrogen diffusion barrier film 402, the fifth hydrogen diffusion barrier film 414, and the sixth hydrogen diffusion barrier film 310 may be 60 nm or more.

Hereinafter, the results of evaluating the properties of the hydrogen diffusion barrier film according to an embodiment of the present invention will be described.

FIG. 24 is a graph showing a hydrogen permeability of a hydrogen diffusion barrier film according to an embodiment of the present invention.

Referring to FIG. 24, the hydrogen permeation prevention properties of the hydrogen diffusion barrier film according to an experimental example of the present invention may be compared. The hydrogen diffusion barrier film according to the experimental example of the present invention may include any one of tin oxide (SnOx), titanium oxide (TiO$_2$), gallium oxide (GaOx), aluminum oxide (Al$_2$O$_3$), or silicon oxide (SiO$_2$), and may be manufactured by plasma atomic layer deposition (PEALD) or thermal atomic layer deposition (Thermal ALD) to have a thickness of 60 nm. A method for manufacturing the hydrogen diffusion barrier film and hydrogen permeability according to the experimental example of the present invention are presented in <Table 1>.

TABLE 1

| | Manufacturing method | Hydrogen permeability ($10^{-10}$ cm$^3$ · cm/ cmHg · cm$^2$ · s) |
|---|---|---|
| p-SnOx(TDMASn) | PEALD (TDMASn precursor) | $1.25 \times 10^{-3}$ |
| p-SnOx(TET) | PEALD (TET precursor) | $1.21 \times 10^{-3}$ |
| SiO$_2$ | PEALD | $4.80 \times 10^{-3}$ |
| TiO$_2$ | PEALD | $9.38 \times 10^{-6}$ |
| GaOx | PEALD | $4.91 \times 10^{-6}$ |
| t-SnOx (TDMASn) | Thermal ALD (TDMASn precursor) | $4.84 \times 10^{-3}$ |
| Al$_2$O$_3$ | Thermal ALD | $5.59 \times 10^{-6}$ |

As described above in FIG. 24 and <Table 1>, the hydrogen diffusion barrier film including the tin oxide is a precursor of the tin oxide and tetrakis (dimethylamino) tin (TDMASn) or tetraethyltin (TET) having a structure of <Formula 2> below was used.

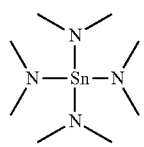

<Formula 1>

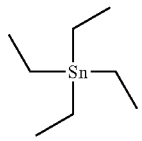

<Formula 2>

In this case, it was confirmed that the hydrogen diffusion barrier films including the tin oxides prepared from two types of precursors, respectively, by the plasma atomic layer deposition has little difference in the hydrogen permeability depending on the precursors.

In contrast, when the hydrogen diffusion barrier film was prepared by thermal ALD, this film exhibited lower hydrogen permeability than the hydrogen diffusion barrier film manufactured by plasma atomic layer deposition. Accordingly, when the hydrogen diffusion barrier film includes the tin oxide, the hydrogen diffusion barrier film manufactured by thermal atomic layer deposition rather than plasma atomic layer deposition may be easily applied to the display device. In addition, the hydrogen diffusion barrier film exhibited lower hydrogen permeability than the hydrogen diffusion barrier film including the titanium oxide, the gallium oxide, the aluminum oxide or the silicon oxide.

In this case, in the case of the hydrogen diffusion barrier film including the titanium oxide, the gallium oxide, the aluminum oxide, or the silicon oxide, the hydrogen diffusion barrier film including the gallium oxide exhibited the lowest hydrogen permeability. In this case, the tin oxide may be a conductive material, and the gallium oxide may be an insulating material. Thus, the hydrogen diffusion barrier film may be manufactured by selecting the type of materials included according to the material layer in contact with the hydrogen diffusion barrier film.

FIG. 25 is a graph showing a hydrogen permeability depending on a thickness of a hydrogen diffusion barrier film according to an embodiment of the present invention, (a) of FIG. 25 is a graph showing the hydrogen permeability according to the thickness of the hydrogen diffusion barrier film including tin oxide, and (b) of FIG. 25 is a graph showing the hydrogen permeability according to the thickness of the hydrogen diffusion barrier film including titanium oxide.

Referring to (a) of FIG. 25, it can be confirmed that the hydrogen permeability changes according to the thickness of the hydrogen diffusion barrier film including the tin oxide manufactured by the plasma atomic layer deposition. When the thickness was less than 60 nm, the hydrogen permeability sharply decreased as the thickness increased. In contrast, when the thickness is 60 nm or more, it was confirmed that the hydrogen permeability becomes almost constant (saturation). Thus, the hydrogen diffusion barrier film may be easily used as a hydrogen diffusion barrier film of the display device at a thickness of 60 nm or more.

Referring to (b) of FIG. 25, it can be confirmed that the hydrogen permeability changes according to the thickness of the hydrogen diffusion barrier film including the titanium oxide manufactured by the plasma atomic layer deposition. As described above in (a) of FIG. 25, the hydrogen permeability decreased as the thickness of the hydrogen diffusion barrier film increased. In this case, when the thickness is 50 nm or more, it was confirmed that the rate of decrease in the hydrogen permeability becomes slow. In other words, as described above in (a) of FIG. 25, the hydrogen permeability was saturated and almost constant. Thus, the hydrogen diffusion barrier film may be easily used as a hydrogen diffusion barrier film of the display device at a thickness of 50 nm or more.

Although the invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

INDUSTRIAL APPLICABILITY

A display device including a hydrogen diffusion barrier film according to an embodiment of the present invention and a method for manufacturing the same can be utilized in various display devices such as an LDC display device, an OLED display device, a display device using a quantum dot, etc.

The invention claimed is:

1. A display device comprising:
 a substrate including a driving area and a pixel area;
 a first transistor on the driving area;
 a second transistor on the pixel area;
 a first hydrogen diffusion barrier film between a first active layer and a first gate insulating film of the first transistor; and
 a second hydrogen diffusion barrier film between a second active layer and a second gate insulating film of the second transistor,
 wherein the first transistor comprises a first gate electrode, a first source electrode and a first drain electrode disposed on the first gate insulating film, and the display device further comprises:
 a first insulating film disposed on the driving area including the first gate electrode, the first source electrode, and the first drain electrode; and
 a third hydrogen diffusion barrier film disposed between the first gate electrode, the first source electrode, the first drain electrode and the first insulating film.

2. The display device of claim 1, wherein the first hydrogen diffusion barrier film and the second hydrogen diffusion barrier film comprise at least any one of aluminum oxide, titanium oxide, tin oxide, gallium oxide, or silicon oxide.

3. The display device of claim 1, wherein the second transistor comprises a second gate electrode, and the display device further comprises:
 a first insulating film disposed between the second gate electrode of the second transistor and the substrate; and
 a fourth hydrogen diffusion barrier film disposed between the first insulating film and the second gate electrode.

4. The display device of claim 3, wherein the second transistor comprises:
 the second active layer disposed on the fourth hydrogen diffusion barrier film; and
 the second source electrode and a second drain electrode, coming into contact with both sides of the second active layer disposed on the second gate insulating film, respectively and the display device further comprises:
 a passivation film on the substrate including the second transistor; and
 a fifth hydrogen diffusion barrier film disposed between the second active layer and the passivation film.

5. A method for manufacturing a display device, the method comprising:
 preparing a substrate including a driving area and a pixel area;
 forming a first transistor on the driving area; and
 forming a second transistor on the pixel area,
 wherein a first hydrogen diffusion barrier film is provided between a first active layer and a first gate insulating film of the first transistor; and
 a second hydrogen diffusion barrier film is provided between a second active layer and a second gate insulating film of the second transistor,
 wherein the forming of the first transistor comprises:
 forming a preliminary active layer on the driving area;
 forming the first active layer by crystallizing the preliminary active layer;
 forming the first hydrogen diffusion barrier film on the first active layer;
 forming the first gate insulating film on the first hydrogen diffusion barrier film formed on the driving area;
 forming a first gate electrode on the first gate insulating film disposed on the first active layer; and
 forming a first source electrode and a first drain electrode, passing through the first gate insulating film to come into contact with both sides of the first active layer.

6. The method of claim 5, further comprising:
 forming a third hydrogen diffusion barrier film on the first gate electrode, the first source electrode, and the first drain electrode, which are disposed on the first gate insulating film, after the manufacturing of the first transistor;
 forming a first insulating film on the driving area and the pixel area of the substrate after the forming of the third hydrogen diffusion barrier film; and
 forming a fourth hydrogen diffusion barrier film on the first insulating film formed on the pixel area.

7. The method of claim 5, wherein the forming of the second transistor comprises:
 forming a second gate electrode on the pixel area;
 forming the second gate insulating film on the second gate electrode formed on the pixel area;
 forming the second hydrogen diffusion barrier film on the second gate insulating film;
 forming the second active layer on the second hydrogen diffusion barrier film; and
 forming a second source electrode and a second drain electrode, coming into contact with both sides of the second active layer, on the second active layer formed on the second hydrogen diffusion barrier film.

8. The method of claim 7, wherein the method comprises:
 forming a fifth hydrogen diffusion barrier film on the second active layer after the manufacturing of the second transistor; and
 forming a passivation layer on the substrate including the first transistor and the second transistor.

9. The method of claim 5, wherein the forming of the first hydrogen diffusion barrier film and the forming of the second hydrogen diffusion barrier film are performed by thermal atomic layer deposition (ALD) or plasma atomic layer deposition (PEALD).

10. The method of claim 9, wherein the forming of the first hydrogen diffusion barrier film and the forming of the second hydrogen diffusion barrier film comprise:
 providing a precursor including a metal in a chamber; and
 providing a reaction gas,
 wherein the metal includes at least any one of aluminum, titanium, tin, gallium, or silicon, and
 the reaction gas includes at least any one of nitrous oxide ($N_2O$) or oxygen ($O_2$).

11. The method of claim 5, wherein the first hydrogen diffusion barrier film comes into contact with the first active layer, and the second hydrogen diffusion barrier film comes into contact with the second active layer, wherein the first hydrogen diffusion barrier film and the second hydrogen diffusion barrier film include a non-tin oxide.

* * * * *